(12) United States Patent
Horii et al.

(10) Patent No.: US 8,193,083 B2
(45) Date of Patent: Jun. 5, 2012

(54) METHOD OF MANUFACTURING SEMICONDUCTOR DEVICE AND SUBSTRATE PROCESSING APPARATUS

(75) Inventors: Sadayoshi Horii, Toyama (JP); Yoshinori Imai, Nanto (JP); Mika Karasawa, Toyama (JP)

(73) Assignee: Hitachi Kokusai Electric Inc., Tokyo (JP)

(*) Notice: Subject to any disclaimer, the term of this patent is extended or adjusted under 35 U.S.C. 154(b) by 264 days.

(21) Appl. No.: 12/230,782

(22) Filed: Sep. 4, 2008

(65) Prior Publication Data
US 2009/0064931 A1    Mar. 12, 2009

(30) Foreign Application Priority Data

Sep. 6, 2007 (JP) ................. 2007-231103
Jul. 11, 2008 (JP) ................. 2008-181943

(51) Int. Cl.
*H01L 21/44* (2006.01)
(52) U.S. Cl. ................. 438/608; 438/785; 257/E21.295
(58) Field of Classification Search ................. 438/590, 438/602, 608; 257/E21.297, E21.536
See application file for complete search history.

(56) References Cited

U.S. PATENT DOCUMENTS

| | | | |
|---|---|---|---|
| 5,834,060 A | 11/1998 | Kawahara et al. | |
| 2004/0058492 A1 | 3/2004 | Tatsumi | |
| 2007/0098892 A1* | 5/2007 | Chung et al. | 427/248.1 |
| 2007/0117407 A1* | 5/2007 | Kwo et al. | 438/778 |
| 2008/0237735 A1* | 10/2008 | Kavalieros et al. | 257/378 |

FOREIGN PATENT DOCUMENTS

| | | |
|---|---|---|
| JP | A-2002-334875 | 11/2002 |
| JP | A-2003-059921 | 3/2003 |
| JP | A-2003-224203 | 8/2003 |
| JP | A-2006-245612 | 9/2006 |
| KR | 10-0272390 | 8/2000 |
| KR | 2003-0045867 | 6/2003 |

OTHER PUBLICATIONS

Mar. 31, 2011 Office Action in Korean Application No. 10-2008-0087583 with translation.
Japanese Office Action issued in JP Application No. 2008-181943 dated Jan. 23, 2012 (w/ Partial Translation).

* cited by examiner

Primary Examiner — Cheung Lee
(74) Attorney, Agent, or Firm — Oliff & Berridge, PLC

(57) ABSTRACT

A method of manufacturing a semiconductor device of the present invention includes a first step of forming a metal oxide film containing at least one or more kinds of elements selected from the group consisting of hafnium, yttrium, lanthanum, aluminium, zirconium, strontium, titanium, barium, tantalum, niobium, on a substrate having a metal thin film formed on the surface, at a first temperature allowing no oxidization of the metal thin film to occur, and allowing the metal oxide film to be set in an amorphous state; and a second step of forming a metal oxide film containing at least one or more kinds of elements selected from the group consisting of hafnium, yttrium, lanthanum, aluminium, zirconium, strontium, titanium, barium, tantalum, niobium on the metal oxide film formed in the first step, up to a target film thickness, at a second temperature exceeding the first temperature.

8 Claims, 9 Drawing Sheets

(a)

(b)

METHOD OF MANUFACTURING SEMICONDUCTOR DEVICE AND SUBSTRATE PROCESSING APPARATUS

BACKGROUND

1. Technical Field

The present invention relates to a method of manufacturing of a semiconductor device and a substrate processing apparatus, for processing a substrate.

2. Description of Related Art

For example, a semiconductor device such as a DRAM includes a metal oxide film formed as a capacitor insulating film. The metal oxide film is formed, for example, on a metal film formed as a lower electrode. Note that the metal oxide film can obtain high dielectric constant when it is crystallized, and therefore is formed under a high temperature so as to be crystallized. For example, the metal oxide film is formed at a high temperature as much as possible in an endurable range in the manufacturing step.

However, when the metal oxide film is formed at the high temperature so as to be crystallized, a base metal thin film is oxidized in some cases. For example, a STO (strontium titanate ($SrTiO_3$)) film, which is highly expected as a capacitor insulating film after the 40 nm generation, can be formed, while being crystallized, by performing film deposition by an ALD method in which organic metal source gas and ozone ($O_3$) gas are alternately supplied at a high temperature of 400° C. or more. However, in this case, ruthenium (Ru) constituting the base metal thin film is exposed to ozone ($O_3$) gas at 400° C. or more to be oxidized to $RuO_2$, and crystal grains constituting the metal thin film is abnormally grown to break through the STO film in some cases.

Therefore, an object of the present invention is to provide a method of manufacturing of a semiconductor device capable of suppressing oxidization of the metal thin film at the time of forming the metal oxide film on the metal thin film, and a substrate processing apparatus.

SUMMARY OF THE INVENTION

According to a first aspect of the present invention, there is provided a method of manufacturing a semiconductor device, including:

a first step of forming a metal oxide film containing at least one or more kinds of elements selected from the group consisting of hafnium, yttrium, lanthanum, aluminium, zirconium, strontium, titanium, barium, tantalum, niobium, on a substrate having a metal thin film formed on the surface, at a first temperature allowing no oxidization of the metal thin film to occur, and allowing the metal oxide film to be set in an amorphous state; and a second step of forming a metal oxide film containing at least one or more kinds of elements selected from the group consisting of hafnium, yttrium, lanthanum, aluminium, zirconium, strontium, titanium, barium, tantalum, niobium on the metal oxide film formed in the first step, up to a target film thickness, at a second temperature exceeding (beyond) the first temperature.

According to another aspect of the present invention, there is provided a method of manufacturing a semiconductor device, including:

a first step of forming a metal oxide film containing at least one or more kinds of elements selected from the group consisting of hafnium, yttrium, lanthanum, aluminium, zirconium, strontium, titanium, barium, tantalum, niobium, on a substrate having a metal thin film formed on the surface, at a first temperature allowing no oxidization of the metal thin film to occur, and allowing the metal oxide film to be set in an amorphous state, and thereafter while maintaining the amorphous state of the metal oxide film, applying annealing to the metal oxide film, to densify the metal oxide film; and a second step of forming a metal oxide film containing at least one or more kinds of elements selected from the group consisting of hafnium, yttrium, lanthanum, aluminium, zirconium, strontium, titanium, barium, tantalum, niobium, up to a target film thickness, at a second temperature exceeding the first temperature.

According to further another aspect of the present invention, there is provided a substrate processing apparatus, including:

a processing chamber that processes a substrate;

a source supply system that supplies at least one of the sources selected from the group consisting of a hafnium source, a yttrium source, a lanthanum source, an aluminium source, a zirconium source, a strontium source, a titanium source, a barium source, a tantalum source, and a niobium source;

an oxidant supply system that supplies oxidant;

a heater that heats the substrate in the processing chamber; and a controller that controls the source supply system, the oxidant supply system, and the heater, so that the source and the oxidant are supplied into the processing chamber to form a metal oxide film containing at least one or more kinds of elements selected from the group consisting of hafnium, yttrium, lanthanum, aluminium, zirconium, strontium, titanium, barium, tantalum, niobium, on a substrate having a metal thin film formed on the surface, at a first temperature not allowing oxidization of the metal thin film to occur and allowing the metal oxide film to be set in an amorphous state, and form a metal oxide film containing at least one or more kinds of elements selected from the group consisting of hafnium, yttrium, lanthanum, aluminium, zirconium, strontium, titanium, barium, tantalum, niobium, on the metal oxide film in the amorphous state, up to a target film thickness, at a second temperature exceeding the first temperature.

According to the method of manufacturing of the semiconductor device and the substrate processing apparatus of the present invention, oxidization of the metal thin film can be suppressed, when the metal oxide film is formed on the metal thin film.

BRIEF DESCRIPTION OF THE DRAWINGS

FIG. 9A shows a vertical sectional face of a processing furnace potion, and FIG. 9B shows the sectional face of the processing furnace part taken along the line A-A.

DESCRIPTION OF PREFERRED EMBODIMENTS OF THE INVENTION

<First Embodiment of the Present Invention>

As described above, when a metal film is formed under a high temperature, a base metal thin film is oxidized in some cases. Strenuous study has been performed by inventors of the present invention, regarding a method of suppressing oxidization of the base metal thin film. As a result, the inventors obtains a knowledge that oxidization of the base metal thin film can be suppressed by forming the metal oxide film at a first temperature, being a temperature not allowing the oxidization of the metal thin film to occur and allowing the metal oxide film to be set in an amorphous state, and thereafter forming the metal oxide film on the metal oxide film formed at the first temperature, up to a target film thickness, at a second temperature larger than the first temperature. Usually, when the metal oxide film is formed directly on the metal thin film at the second temperature, the metal thin film is sometimes oxidized. However, according to the aforementioned method, the metal oxide film previously formed at the first temperature functions as a barrier for suppressing transmission of oxygen. Therefore, even when the metal oxide film is formed at the second temperature, oxidization of the base metal thin film is suppressed. The present invention is provided based on the aforementioned knowledge obtained by the inventors. An embodiment of the present invention will be explained hereunder.

(1) Structure of the Substrate Processing Apparatus

Figure 4:
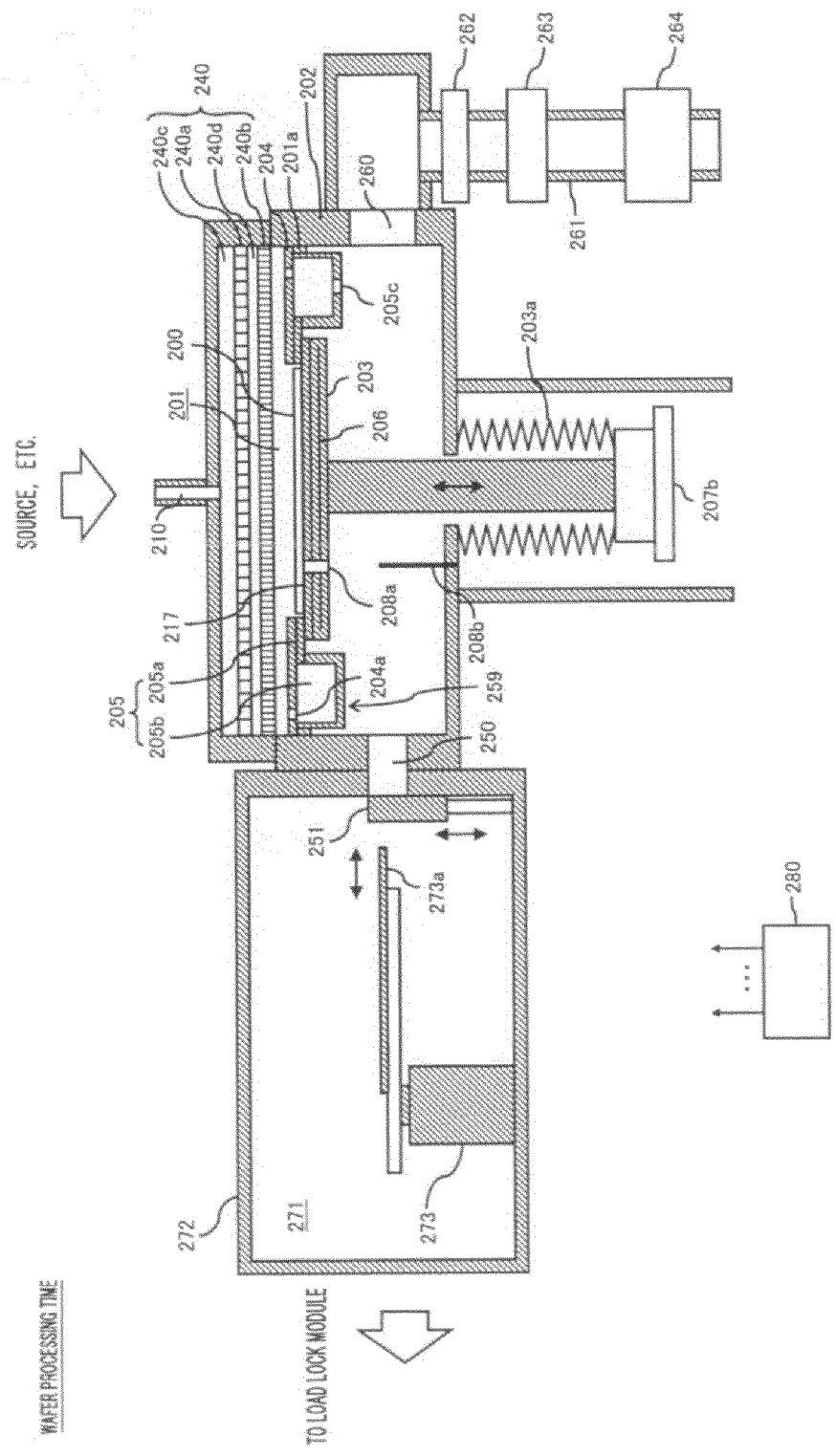
FIG. 4 is a sectional block diagram at the time of processing a wafer of the substrate processing apparatus according to an embodiment of the present invention.

First, the structure of the substrate processing apparatus according to this embodiment will be explained, with reference to FIGS. 4 and 5. FIG. 4 is a sectional block diagram at the time of a processing a wafer of the substrate processing apparatus according to an embodiment of the present invention, and FIG. 5 is a sectional block diagram at the time of transferring the wafer of the substrate processing apparatus according to an embodiment of the present invention.

<Processing Chamber>

Figure 5:
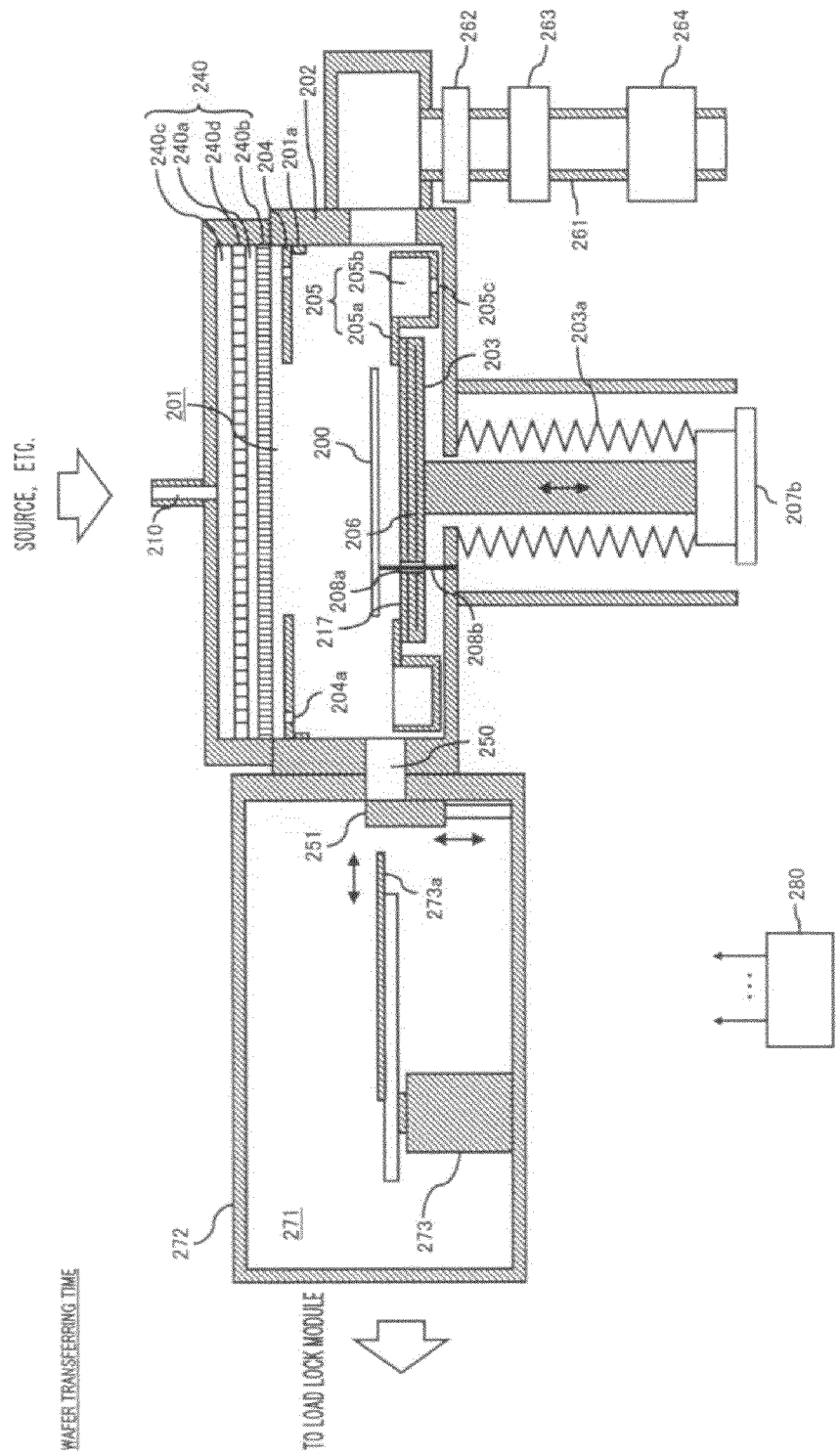
FIG. 5 is a sectional block diagram at the time of transferring the wafer of the substrate processing apparatus according to an embodiment of the present invention.

As shown in FIGS. 4 and 5, the substrate processing apparatus according to this embodiment includes a processing vessel 202. The processing vessel 202 is constituted as a flat air-tightly closed vessel, with horizontal sectional face formed into a circular shape. In addition, the processing vessel 202 is constituted of metal materials such as aluminium (Al) and stainless (SUS). A processing chamber 201 for processing a wafer 200, being a substrate, is constituted in the processing vessel 202.

A support base 203 for supporting the wafer 200 is provided in the processing chamber 201. A susceptor 217, being a supporting plate, constituted of, for example, quartz ($SiO_2$), carbon, ceramics, silicon carbide (SiC), aluminium oxide ($Al_2O_3$), or aluminium nitride (AlN), etc, is provided on an upper surface of the support base 203 in direct contact with the wafer 200. In addition, a heater 206 is incorporated in the support base 203, as a heating unit for heating the wafer 200 in the processing chamber 201. Note that the lower end portion of the support base 203 penetrates a bottom part of the processing vessel 202.

An elevating mechanism 207b is provided outside the processing chamber 201, by operating (elevating) this elevating mechanism 207b, the wafer 200 supported on the susceptor 217 can be elevated. The support base 203 is lowered to a position (wafer transfer position) shown in FIG. 5 at the time of transferring the wafer 200, and is elevated to a position (wafer processing position) shown in FIG. 4 at the time of processing the wafer 200. Note that the lower end portion of the support base 203 and a circumference of the elevating mechanism 207b are covered with a bellows 203a, and inside of the processing chamber 201 is air-tightly maintained.

In addition, for example, three lift pins 208b are vertically provided on a bottom face (floor face) of the processing chamber 201. Also, through holes 208a for penetrating the lift pins 208b are provided at positions corresponding to the lift pins 208b. Then, when the support base 203 is lowered to the wafer transfer position, the upper end portions of the lift pins 208b are protruded from the upper surface f the support base 203, so that the lift pins 208b are supported from below. In addition, when the support base 203 is elevated to the wafer processing position, the lift pins 208b are embedded from the upper surface of the support base 203, so that the wafer 200 is supported from below by the susceptor 217 provided on the upper surface of the support base 203. Note that the lift pins 208b are preferably formed by materials such as quartz or alumina, because the lift pins 208b are set in a direct contact with the wafer 200.

<Wafer Transfer Opening>

A wafer transfer opening 250 for transferring the wafer 200 inside/outside the processing chamber 201 is provided on the side face of an inner wall of the processing chamber 201. A gate valve 251 is provided in the wafer transfer opening 250, and by opening the gate valve 251, the inside of the processing chamber 201 and the inside of a transfer chamber (preliminary chamber) 271 are communicated with each other. The transfer chamber 271 is formed in an air-tightly closed vessel 272, and a transfer robot 273 for transferring the wafer 200 is provided in the transfer chamber 271. A transfer arm 273a for supporting the wafer 200 in transferring the wafer 200 is provided in the transfer robot 273. By opening the gate valve 251 in a state of lowering the support base 203 to the wafer transfer position, the wafer can be transferred between the inside of the processing chamber 201 and the inside of the transfer chamber 271 by the transfer robot 273. The wafer 200 transferred into the processing chamber 201 is temporarily placed on the lift pins 208b.

<Exhaust System>

An exhaust port 260 for exhausting an atmosphere in the processing chamber 201 is provided on the side face of an inner wall of the processing chamber 201 and on the opposite side to the wafer transfer opening 250. An exhaust pipe 261 is connected to the exhaust port 260, and a pressure adjuster 262 such as an APC (Auto Pressure Controller) for controlling the inside of the processing chamber 201 to a prescribed pressure, a source recovery trap 263, and a vacuum pump 264 are sequentially connected to the exhaust pipe 261 in series. An exhaust system (exhaust line) is mainly constituted of the exhaust port 260, the exhaust pipe 261, the pressure adjuster 262, the source recovery trap 263, and the vacuum pump 264.

<Gas Inlet Port>

A gas inlet port 210 for supplying each kind of gas into the processing chamber 201 is provided on the upper surface (ceiling wall) of a shower head 240 as will be described later provided in the upper part of the processing chamber 201. Note that the gas supply system connected to the gas inlet port 210 will be described later.

<Shower Head>

The shower head 240, being a gas dispersion mechanism, is provided between the gas inlet port 210 and the wafer 200 at the wafer processing position. The shower head 240 includes a dispersion plate 240a for dispersing gas introduced from the gas inlet port 210, and a shower plate 240b for further uniformly dispersing the gas passed through the dispersion plate 240a and supplying the gas to the surface of the wafer 200 on the support base 203. A plurality of vent holes are provided on the dispersion plate 240a and the shower plate 240b. The dispersion plate 240a is disposed so as to be opposed to the upper surface of the shower head 240 and the shower plate 240b, and the shower plate 240b is disposed so as to be opposed to the wafer 200 on the support base 203. Note that space is respectively provided between the upper surface of the shower head 240 and the dispersion plate 240a, and between the dispersion plate 240a and the shower plate 240b, and such a space function as a dispersion chamber (first buffer space) 240c for dispersing the gas supplied from the gas inlet port 210, and a second buffer space 240d for dispersing the gas passed through the dispersion plate 240a.

<Exhaust Duct>

A step part 201a is provided on the inner wall side face of the processing chamber 201. Then, this step part 201a is constituted so as to hold a conductance plate 203 in the vicinity of the wafer processing position. The conductance plate 204 is constituted as a disc formed into a donut shape (ring shape), with a hole provided in an inner circumferential part, for storing the wafer 200 therein. A plurality of discharge ports 204a arranged in a circumferential direction at prescribed intervals are provided on an outer circumferential part of the conductance plate 204. The discharge ports s204a are discontinuously formed so as to support the inner circumferential part of the conductance plate 204 by the outer circumferential part of the conductance plate 204.

Meanwhile, a lower plate 205 is locked to the outer circumferential part of the support base 203. The lower plate 205 includes a ring-shaped recess portion 205b and a flange part 205a provided integrally with upper inside of the recess portion 205b. The recess portion 205b is provided so as to close a gap between the outer circumferential part of the support base 203 and the inner wall side face of the processing chamber 201. A plate exhaust port 205c is provided in a part of the bottom part of the recess portion 205b near the exhaust port 260, for discharging (circulating) the gas toward the exhaust port 260 from the inside of the recess portion 205b. The flange part 205a functions as a lock part to be locked to an upper outer circumferential edge of the support base 203. By locking the flange part 205a to the upper outer circumferential edge of the support base 203, the lower plate 205 is elevated/lowered together with the support base 203, with elevation/lowering of the support base 203.

When the support base 203 is elevated to the wafer processing position, the lower plate 205 is also elevated to the wafer processing position. As a result, an upper surface of the recess portion 205b of the lower plate 205 is closed by the conductance plate 204 held near the wafer processing position, thus forming an exhaust duct 259, with inside of the recess portion 205b set as a gas flow area. Note that at this time, the inside of the processing chamber 201 is partitioned by an upper part of the processing chamber above the exhaust duct 259 and a lower part of the processing chamber below the exhaust duct 259. Note that it is preferable to form the conductance plate 204 and the lower plate 205 by a material that can be maintained at high temperature, for example quartz for high load resistant to high temperature.

Here, explanation is given for a gas flow in the processing chamber 201 at the time of processing the wafer. First, the gas supplied to the upper part of the shower head 240 from the gas inlet port 210 is passed through the dispersion chamber (first buffer space) 240c to enter into the second buffer 240d from a plurality of holes of the dispersion plate 240a, and further is passed through a plurality of holes of the shower plate 240b to be supplied into the processing chamber 201, and is uniformly supplied onto the wafer 200. Then, the gas supplied onto the wafer 200 is radially flown toward outside of the wafer 200 in a diameter direction. Then, extra gas after being brought into contact with the wafer 200 is flown radially toward the outside of the wafer 200 in the diameter direction over the exhaust duct 259 (namely, over the conductance plate 204) provided on the outer circumference of the support base 203, and is discharged into the gas flow area (into the recess portion 205b) in the exhaust duct 259, from the exhaust port 204a provided on the exhaust duct 259. Thereafter, the gas is flown through the exhaust duct 259, passed through a plate exhaust port 205c, and is exhausted to the exhaust port 260. As described above, it is possible to suppress infiltration of gas to the lower part of the processing chamber 201, namely, to the rear surface of the support base 203 and the bottom surface side of the processing chamber 201.

Figure 1:
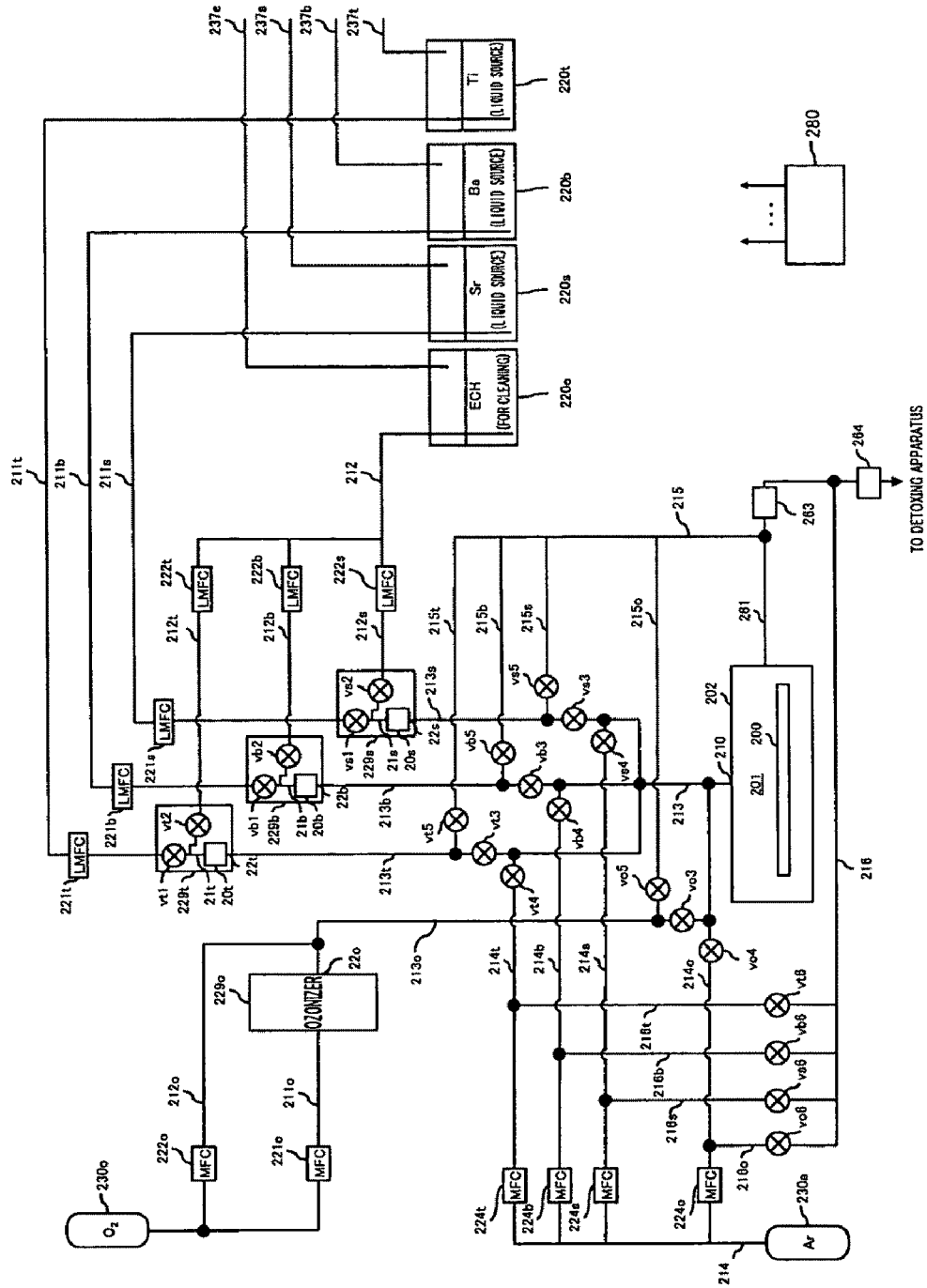
FIG. 1 is a block diagram of a gas supply system of a substrate processing apparatus according to an embodiment of the preset invention.
Figure 7:
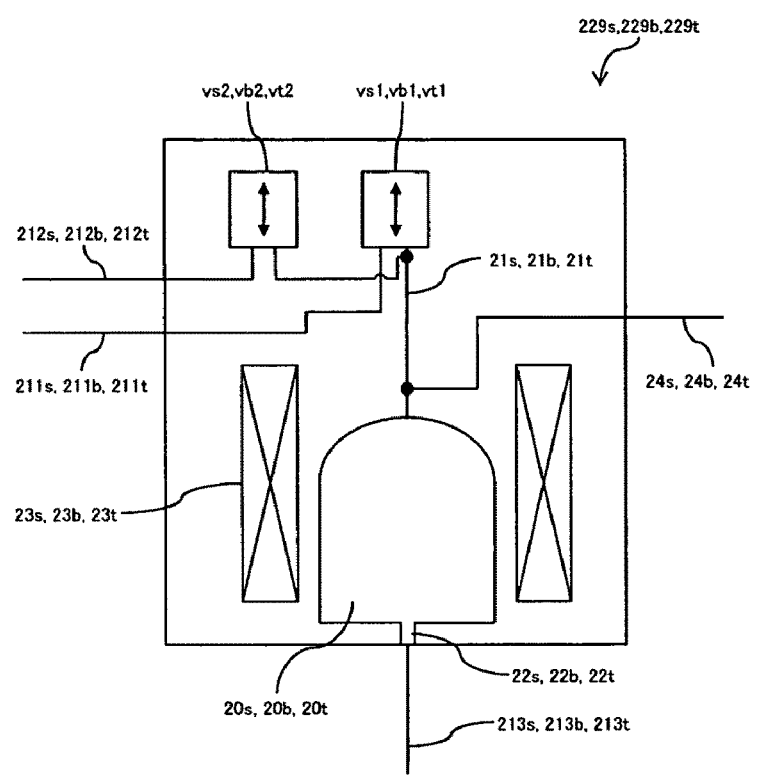
FIG. 7 is a schematic block diagram of a vaporizer according to an embodiment of the present invention.

Next, explanation will be given for the aforementioned structure of the gas supply system connected to the gas inlet port 210, with reference to FIGS. 1 and 7. FIG. 1 is a block diagram of the gas supply system (gas supply line) of the substrate processing apparatus according to an embodiment of the present invention, and FIG. 7 is a schematic block diagram of a vaporizer according to an embodiment of the present invention.

The gas supply system of the substrate processing apparatus according to an embodiment of the present invention includes a source supply system for supplying any one of the sources selected from the group consisting of a hafnium (Hf) source, a yttrium (Y) source, a lanthanum (La) source, an aluminium (Al) source, a zirconium (Zr) source, a strontium (Sr) source, a titanium (Ti) source, a barium (Ba) source, a tantalum (Ta) source, and a niobium (Nb) source, and an oxidant supply system for supplying oxidant. The source supply system according to this embodiment includes a first liquid source supply source 220s, a second liquid source supply source 220b, a third liquid source supply source 220t for supplying liquid source; vaporizing parts 229s, 229b, 229t for vaporizing the liquid source; liquid source supply pipes 211s, 211b, 211t for supplying the liquid source to the vaporizing parts 229s, 229b, 229t; and a source gas supply pipe 213 for supplying the source gas obtained by vaporizing the liquid source in the vaporizing parts 229s, 229b, 229t. In addition, the oxidant supply system according to this embodiment includes an oxygen gas supply source 230o for supplying oxygen (O2) gas; an ozonizer 229o for generating ozone (O3) gas, being the oxidant, from the oxygen gas; an oxygen gas supply pipe 211o for supplying the oxygen gas to the ozonizer 229o; and an oxidant supply pipe 213o for supplying the ozone gas generated by the ozonizer 229o into the processing chamber 201. Further, the substrate processing apparatus according to an embodiment of the present invention includes a cleaning liquid supply system for supplying cleaning liquid to the vaporizing part; a purge gas supply system; and a vent (bypass) system. Explanation will be given hereunder, for the source supply system for supplying sources such as strontium source, titanium source, and barium source; and the oxidant supply system for supplying ozone gas as the oxidant.

<Source Supply System>

Outside of the processing chamber 201, there are provided the first liquid source supply source 220s for supplying an organic metal liquid source (called a first liquid source hereunder) containing Sr (strontium), being the liquid source, the second liquid source supply source 220b for supplying an organic metal liquid source (called a second liquid source hereunder) containing Ba (barium) element, and the third liquid source supply source 220t for supplying an organic metal liquid source (called a third liquid source hereunder) containing Ti (titanium) element. The first liquid source supply source 220s, the second liquid source supply source 220b, and the third liquid source supply source 220t are respectively constituted as a tank (air-tightly closed vessel) capable of storing (filling) the liquid source inside. Note that each organic metal liquid source containing Sr, Ba, and Ti elements is diluted to 0.05 mol/L to 0.2 mol/L by the solvent such as ECH (ethylcyclohexane) or THF (tetrahydrofuran) and then is respectively stored in the tank.

Here, a first pressurized gas supply pipe 237s, a second pressurized gas supply pipe 237b, and a third pressurized gas supply pipe 237t are respectively connected to the first liquid source supply source 220s, the second liquid source supply source 220b, and the third liquid source supply source 220t. A pressurized gas supply source source not shown is connected to upper stream side end portions of the first pressurized gas supply pipe 237s, the second pressurized gas supply pipe 237b, and the third pressurized gas supply pipe 237t. Also, lower stream side end portions of the first pressurized gas supply pipe 237s, the second pressurized gas supply pipe 237b, and the third pressurized gas supply pipe 237t are communicated with a space that exists in an upper part of the first liquid source supply source 220s, the second liquid source supply source 220b, and the third liquid source supply source 220t, so that pressurized gas is supplied into this space. Note that it is preferably to use the gas not reactive with the liquid source, and for example inert gas such as Ar gas is suitably used.

Also, the first liquid source supply pipe 211s, the second liquid source supply pie 211b, and the third liquid source supply pipe 211t are respectively connected to the first liquid source supply source 220s, the second liquid source supply source 220b, and the third liquid source supply source 220t. Here, side end portions of the upper stream of the first liquid source supply pipe 211s, the second liquid source supply pipe 211b, and the third liquid source supply pipe 211t are respectively immersed into the liquid source stored in the first liquid source supply source 220s, the second liquid source supply source 220b, and the third liquid source supply source 220t. Also, side end portions of the lower stream of the first liquid source supply pipe 211s, the second liquid source supply pipe 211b, and the third liquid source supply pipe 211t are respectively connected to vaporizers 229s, 229b, 229t, being the vaporizer for vaporizing the liquid staring material. Note that liquid flow controllers (LMFC) 221s, 221b, 221t, being flow control units for controlling supply flow rate of the liquid source, and open/close valves vs1, vb1, vt1 for controlling supply of the liquid source are respectively provided in the first liquid source supply pipe 211s, the second liquid source supply pipe 211b, and the third liquid source supply pipe 211t. Note that the open/close valves vs1, vb1, and vt1 are respectively provided inside of the vaporizers 229s, 229b, and 229t.

With the aforementioned structure, by opening the open/close valves vs1, vb1, vt1, and supplying the pressurized gas from the first pressurized gas supply pipe 237s, the second pressurized gas supply pipe 237b, and the third pressurized gas supply pipe 237t, the liquid source can be fed (supplied) to the vaporizers 229s, 229b, and 229t, from the first liquid source supply source 220s, the second liquid source supply source 220b, and the third liquid source supply source 220t. The liquid source supply system (liquid source supply line) is mainly constituted of the first liquid source supply source 220s, the second liquid source supply source 220b, the third liquid source supply source 220t, the first pressurized gas supply pipe 237s, the second pressurized gas supply pipe 237b, the third pressurized gas supply pipe 237t, the first liquid source supply pipe 211s, the second liquid source supply pipe 211b, the third liquid source supply pipe 211t, the liquid flow controllers 221s, 221b, 221t, and the open/close valves vs1, vb1, and vt1.

As shown in FIG. 7 as a detailed structure, the vaporizers 229s, 229b, 229t, being the vaporizers for vaporizing the liquid source, have vaporizing chambers 20s, 20b, 20t for generating the source gas obtained by heating and vaporizing the liquid staring material by heaters 23s, 23b, 23t; liquid source flow passages 21s, 21b, 21t, being flow passages to eject the liquid source into the vaporizing chambers 20s, 20b, 20t; the aforementioned open/close valves vs1, vb1, vt1 for controlling supply of the liquid source into the vaporizing chambers 20s, 20b, 20t; and source gas supply ports 22s, 22b, 22t, being outlets for supplying the source gas generated by the vaporizing chambers 20s, 20b, 20t to a first source gas supply pipe 213s, a second source gas supply pipe 213b, a third source gas supply pipe 213t as will be described later. Lower stream side end portions of the first liquid source supply pipe 211s, the second liquid source supply pipe 211b, and the third liquid source supply pipe 211t are respectively connected to the upper stream side end portions of the liquid source flow passages 21s, 21b, 21t via the open/close valves vs1, vb1, vt1. Carrier gas supply pipes 24s, 24b, 24t, being a carrier gas supply system (carrier gas supply lines) are respectively connected to the liquid source flow passages 21s, 21b, 21t, so that carrier gas such as Ar is supplied into the vaporizing chambers 20s, 20b, 20t.

Upper stream side end portions of the first source gas supply pipe 213s, the second source gas supply pipe 213b, and the third source gas supply pipe 213t are connected to the source gas supply ports 22s, 22b, 22t of the vaporizers 229s, 229b, 229t, respectively. Lower stream side end portions of the first source gas supply pipe 213s, the second source gas supply pipe 213b, and the third source gas supply pipe 213t are combined into one so as to be merged with one another, to become the source gas supply pipe 213, and the source gas supply pipe 213 thus combined into one is connected to the gas inlet port 210. Note that open/close valves vs3, vb3, vt3 for controlling supply of the source gas into the processing chamber 201 are respectively provided in the first source gas supply pipe 213s, the second source gas supply pipe 213b, and the third source gas supply pipe 213t.

With the above-described structure, the source gas can be generated by vaporizing the liquid source by the vaporizers 229s, 229b, and 229t, and by opening the open/close valves vs3, vb3, vt3, the source gas can be supplied into the processing chamber 201, via the source gas supply pipe 213 from the first source gas supply pipe 213s, the second source gas supply pipe 213b, and the third source gas supply pipe 213t. The source gas supply system (source gas supply line) is mainly constituted of the first source gas supply pipe 213s, the second source gas supply pipe 213b, the third source gas supply pipe 213t, the source gas supply pipe 213, the open/close valves vs3, vb3, vt3. Then, the source supply system is mainly constituted of the liquid source supply system, the vaporizing part, and the source gas supply system.

<Oxidant Supply System>

Also, an oxygen gas supply source 230o for supplying oxygen ($O_2$) gas is provided outside of the processing chamber 201. The upper stream side end portion of the first oxygen gas supply pipe 211o is connected to the oxygen gas supply source 230o. The ozonizer 229o for generating reaction gas (reaction substance), namely the ozone gas, being the oxidant, from the oxygen gas by plasma is connected to the lower stream side end portion of the first oxygen gas supply pipe 211o. Note that a flow rate controller 221o, being a flow control unit for controlling a supply flow rate of the oxygen gas is provided in the first oxygen gas supply pipe 211o.

The upper stream side end portion of the ozone gas supply pipe 213o, being the oxidant supply pipe, is connected to the ozone gas supply port 220o, being the outlet of the ozonizer 229o. In addition, the lower stream side end portion of the ozone gas supply pipe 213o is connected to the source gas supply pipe 213 so as to be merged therewith. Namely, the ozone gas supply pipe 213o is constituted to supply the ozone gas, being the oxidant, into the processing chamber 201. Note that the open/close valve vo3 for controlling supply of the ozone gas into the processing chamber 201 is provided in the ozone gas supply pipe 213o.

Note that the upper stream side end portion of the second oxygen gas supply pipe 212o is connected to the upper stream side from the flow controller 221o of the first oxygen gas supply pipe 211o. Also, the lower stream side end portion of the second oxygen gas supply pipe 212o is connected to the upper stream side from the open/close valve vo3 of the ozone gas supply pipe 213o. Note that the flow controller 222o, being the flow control unit, for controlling the supply flow rate of the oxygen gas is provided in the second oxygen gas supply pipe 212o.

With the above-described structure, the oxygen gas is supplied to the ozonizer 229o to generate the ozone gas, and by opening/closing the valve vo3, the ozone gas can be supplied into the processing chamber 201. Note that by supplying the oxygen gas from the second oxygen gas supply pipe 212o, during supply of the ozone gas into the processing chamber 201, the ozone gas supplied into the processing chamber 201 can be diluted by the oxygen gas and concentration of the ozone gas can be adjusted. The oxidant supply system (oxidant supply line) is mainly constituted of the oxygen gas supply source 213o, the open/close valve vo3, the second oxygen gas supply pipe 212o, and the flow rate controller 222o.

<Cleaning Liquid Supply System (Solvent Supply System)>

In addition, a cleaning liquid supply source 220e for supplying ECH (ethylcyclohexane), being the solvent as a cleaning liquid is provided outside of the processing chamber 201. The cleaning liquid supply source 220e is constituted as a tank (air/tightly closed vessel) capable storing (filling) the cleaning liquid inside. Note that the cleaning liquid is not limited to the ECH, and the solvent such as THF (tetrahydrofuran) can be used.

Here, a cleaning liquid pressurized gas supply pipe 237e is connected to the cleaning liquid supply source 220e. A pressurized gas supply source not shown is connected to the upper stream side end portion of the cleaning liquid pressurized gas supply pipe 237e. Also, the lower stream side end portion of the cleaning liquid pressurized gas supply pipe 237e is communicated with a space that exists in the upper part of the cleaning liquid supply source 2203, so that the pressurized gas is supplied into this space. Note that as the pressurized gas, inert gas such as Ar gas is suitably used.

Also, the cleaning liquid supply pipe 212 is connected to the cleaning liquid supply source 220e. The upper stream side end portion of the cleaning liquid supply pipe 212 is immersed into the cleaning liquid stored in the cleaning liquid supply source 220e. The lower stream side end portion of the cleaning liquid supply pipe 212 is branched to three lines, namely, a first cleaning liquid supply pipe 212s, a second cleaning liquid supply pipe 212b, and a third cleaning liquid supply pipe 212t. The lower stream side end portions of the first cleaning liquid supply pipe 212s, the second cleaning liquid supply pipe 212b, and the third cleaning liquid supply pipe 212t are respectively connected to the liquid source flow passages 21s, 21b, 21t of the vaporizers 229s, 229b, and 229t. Note that liquid flow rate controllers 222s, 222b, 22t, being flow rate control units for controlling the supply flow rate of the cleaning liquid, and open/close valves vs2, vb2, vt2 for controlling supply of the cleaning liquid, are respectively provided in the first cleaning liquid supply pipe 212s, the second cleaning liquid supply pipe 212b, and the third cleaning liquid supply pipe 212t. Note that the open/close valves vs2, vb2, vt2 are respectively provided inside of the vaporizers 229s, 229b, and 229t.

With the above-described structure, by supplying the pressurized gas from the cleaning liquid pressurized gas supply pipe 237e, and closing the open/close valves vs1, vb1, vt1, and opening the open/close valves vs2, vb2, vt2, the cleaning liquid can be fed (supplied) under pressure into the liquid source flow passages 21s, 21b, 21t of the vaporizers 229s, 229b, 229t, and the inside of the liquid source flow passages 21s, 21b, 21t can be cleaned. The cleaning liquid supply system (solvent supply system), namely, the cleaning liquid supply line (solvent supply line) is mainly constituted of the cleaning liquid supply source 220e, the cleaning liquid pressurized gas supply pipe 237e, the cleaning liquid supply pipe 212, the first cleaning liquid supply pipe 212s, the second cleaning liquid supply pipe 212b, the third cleaning liquid supply pipe 212t, the liquid flow rate controllers 222s, 222b, 222t, and the open/close valves vs2, vb2, vt2.

<Purge Gas Supply System>

In addition, an Ar gas supply source 230a for supplying Ar gas, being purge gas, is provided outside of the processing chamber 201. The upper stream side end portion of a purge gas supply pipe 214 is connected to the Ar gas supply source 230a. The lower streams side end portion of the purge gas supply pipe 214 is branched to four lines, namely, a first purge gas supply pipe 214s, a second purge gas supply pipe 214b, a third purge gas supply pipe 214t, and a fourth purge gas supply pipe 214o. The lower stream side end portions of the first purge gas supply pipe 214s, the second purge gas supply pipe 214b, the third purge gas supply pipe 214t, and the fourth purge gas supply pipe 214o are respectively connected to the lower stream sides of the open/close valves vs3, vb3, vt3, vo3 of the first source gas supply pipe 213s, the second source gas supply pipe 213b, the third source gas supply pipe 213t, and the ozone gas supply pipe 213o. Note that flow rate controllers 224s, 224b, 224t, 224o, and open/close valves vs4, vb4, vt4, vo4 for controlling supply of the Ar gas are respectively provided in the first purge gas supply pipe 214s, the second purge gas supply pipe 214b, the third purge gas supply pipe 214t, and the fourth purge gas supply pipe 214o. The purge gas supply system (purge gas supply line) is mainly constituted of the Ar gas supply source 230a, the purge gas supply pipe 214, the first purge gas supply pipe 214s, the second purge gas supply pipe 214b, the third purge gas supply pipe 214t, the fourth purge gas supply pipe 214o, the flow rate controllers 224s, 224b, 224t, 224o, and the open/close valves vs4, vb4, vt4, vo4.

<Vent (Bypass) System>

Also, upper stream side end portions of a first vent pipe 215s, a second vent pipe 215b, a third vent pipe 215t, a fourth vent pipe 215o are respectively connected to the upper stream sides of the first source gas supply pipe 213s, the second source gas supply pipe 213b, the third source gas supply pipe 213t, and the ozone gas supply pipe 213o. Also, lower stream side end portions of the first vent pipe 215s, the second vent pipe 215b, the third vent pipe 215t, and the fourth vent pipe 215o are combined into one so as to be merged with one another, to become a vent pipe 215, and the vent pipe 215 is connected to the upper stream side from the source recovery trap 263 of the exhaust pipe 261. Open/close valves vs5, vb5, vt5, vo5 for controlling supply of the gas are respectively provided in the first vent pipe 215s, the second vent pipe 215b, the third vent pipe 215t, and the fourth vent pipe 215o.

With the above-described structure, by closing the open/close valves vs3, vb3, vt3, vo3, and by opening the open/close valves vs5, vb5, vt5, vo5, the gas flowing through the first source gas supply pipe 213s, the second source gas supply pipe 213b, the third source gas supply pipe 213t, and the ozone gas supply pipe 213o can bypass the processing chamber 201 without being supplied into the processing chamber 201, and can be respectively exhausted to the outside of the processing chamber 201.

Also, a fifth vent pipe 216s, a sixth vent pipe 216b, a seventh vent pipe 216t, an eighth vent pipe 216o are respectively connected the upper stream sides from the open/close valves vs4, vb4, vt4, vo4 of the first purge gas supply pipe 214s, the second purge gas supply pipe 214b, the third purge gas supply pipe 214t, and the fourth purge gas supply pipe 214o, and lower stream sides from the flow rate controllers 224s, 224b, 224t, 224o. Also, lower stream side end portions of a fifth vent pipe 216s, a sixth vent pipe 216b, a seventh vent pipe 216t, and an eighth vent pipe 216o are combined into one so as to be merged with one another, to become a vent pipe 216, and the vent pipe 216 is connected to the lower stream side from the source recovery trap 263 of the exhaust pipe 261 and the upper stream side from the vacuum pump 264. Open/close valves vs6, vb6, vt6, vo6 for controlling supply of the gas are respectively provided in the fifth vent pipe 216s, the sixth vent pipe 216b, the seventh vent pipe 216t, and the eighth vent pipe 216o.

With above-described structure, by closing the open/close valves vs4, vb4, vt4, vo4, and by opening the open/close valves vs6, vb6, vt6, vo6, the Ar gas flowing through the first purge gas supply pipe 214s, the second purge gas supply pipe 214b, the third purge gas supply pipe 214t, and the fourth purge gas supply pipe 214o can bypass the processing chamber 201 without being supplied into the processing chamber 201, and can be exhausted to the outside of the processing chamber 201 respectively. Note that by closing the open/close valves vs3, vb3, vt3, vo3, and by opening the open/close valves vs5, vb5, vt5, vo5, the gas flowing through the first source gas supply pipe 213s, the second source gas supply pipe 213b, the third source gas supply pipe 213t, and the ozone gas supply pipe 213o can bypass the processing chamber 201 without being supplied into the processing chamber 201 and can be exhausted to the outside of the processing chamber 201, and in this case, by opening the open/close valves vs4, vb4, vt4, vo4, the Ar gas is introduced into the first source gas supply pipe 213s, the second source gas supply pipe 213b, the third source gas supply pipe 213t, and the ozone gas supply pipe 213o, and the inside of each source gas supply pipe is purged. Also, the open/close valves vs6, vb6, vt6, vo6 are set to be reversely operated to the open/close valves vs4, vb4, vt4, vo4, and when the Ar gas is not supplied into each source gas supply pipe, the processing chamber 201 is bypassed to exhaust the Ar gas. A vent system (bypass system), namely, a vent line (bypass line) is mainly constituted of the first vent pipe 215s, the second vent pipe 215b, the third vent pipe 215t, the fourth vent pipe 215o, the vent pipe 215, the fifth vent pipe 216s, the sixth vent pipe 216b, the seventh vent pipe 216t, the eighth vent pipe 216o, the vent pipe 216, the open/close valves vs5, vb5, vt5, vo5, and the open/close valves vs6, vb6, vt6, vo6.

<Controller>

Note that the substrate processing apparatus according to this embodiment has a controller 280 for controlling the operation of each part of the substrate processing apparatus. The controller 280 controls the gate valve 251, the elevating mechanism 207b, the transfer robot 273, the heater 206, the pressure adjuster (APC) 262, the vaporizers 229s, 229b, 229t, the ozonizer 229o, the vacuum pump 264, the open/close valves vs1, vs6, vb1 to vb6, vt1 vt6, vo3 to vo6, the liquid flow rate controllers 221s, 221b, 221t, 222s, 222b, 222t, and the flowrate controllers 224s, 224b, 224t, 221o, 222o, 224o, etc.

As described above, the substrate processing apparatus according to an embodiment of the present invention is constituted.

(2) Substrate Processing Step

Figure 2:
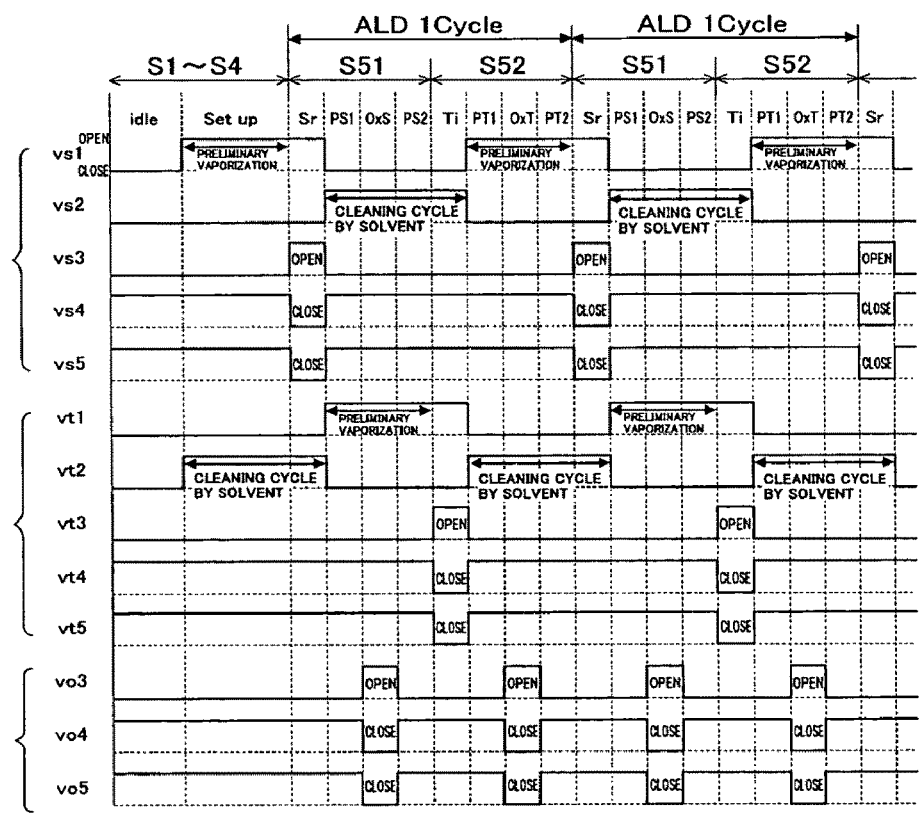
FIG. 2 is a sequence chart showing an opening/closing timing of each valve of the substrate processing apparatus according to an embodiment of the present invention.
Figure 6:
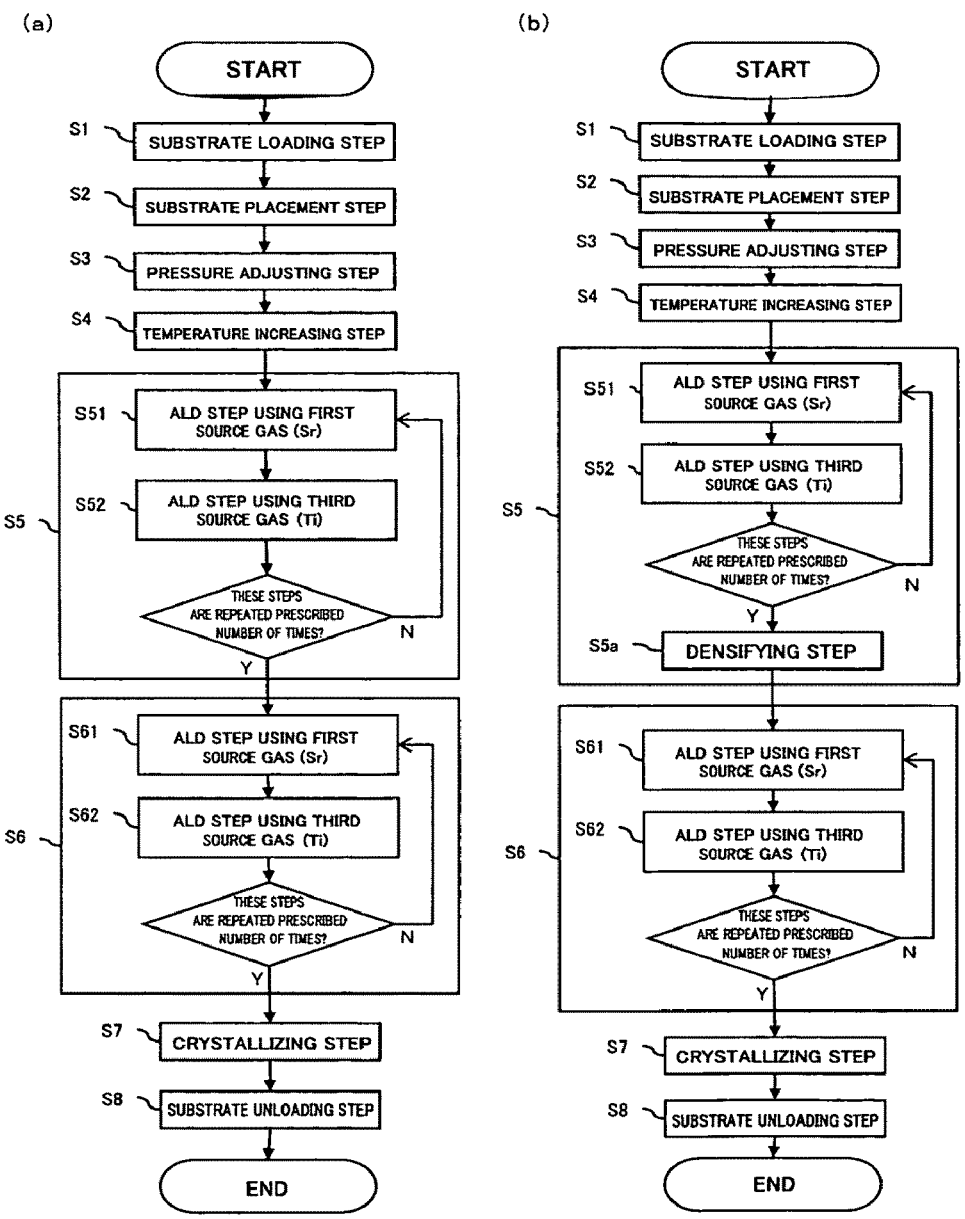
FIG. 6A is a flowchart of the substrate processing steps according to an embodiment of the present invention.
FIG. 6B is a flowchart of the substrate processing steps according other embodiment of the present invention.

Next, as one step of the manufacturing steps of the semiconductor device according to an embodiment of the present invention, explanation will be given for a substrate processing step of forming a STO (SrTiO$_3$) film, being a metal oxide film containing, for example, strontium and titanium, by an ALD method, with reference to FIG. 2 and FIG. 6A. FIG. 6A is a flowchart of the substrate processing step according to an embodiment of the present invention. FIG. 2 is a sequence chart as a timing chart showing an opening/closing timing of each valve of the substrate processing apparatus according to an embodiment of the present invention. In this timing chart, High level shows "Open" of the valve, and Low level shows "Close" of the valve. Note that in the explanation given hereunder, the operation of each part constituting the substrate processing apparatus is controlled by the controller 280.

<Substrate Loading Step (S1), Substrate Placement Step (S2)>

First, the elevating mechanism 207b is operated, and the support base 203 is lowered to the wafer transfer position shown in FIG. 5. Then, the gate valve 251 is opened, so that the processing chamber 201 and the transfer chamber 271 are communicated with each other. Then, the wafer 200 to be processed is loaded into the processing chamber 201 from the transfer chamber 271 by the transfer robot 273 in a state of being supported by the transfer arm 273 (S1). Note that an oxide film such as a SiO2 is formed on the surface of the wafer 200, and ruthenium (Ru), being a metal thin film, is previously formed on this oxide film. The ruthenium thin film becomes a base for forming the STO film, being the metal oxide film. The wafer 200 loaded into the processing chamber 201 is temporarily placed on the lift pins 208b protruded from the upper surface of the support base 203. When the transfer arm 273a of the transfer robot 273 is returned into the transfer chamber 271 form the processing chamber 201, the gate valve 251 is closed.

Subsequently, the elevating mechanism 207b is operated, and the support base 203 is elevated to the wafer processing position shown in FIG. 4. As a result, the lift pins 208b are embedded from the upper surface of the support base 203, and the wafer 200 is placed on the susceptor 217 of the upper surface of the support base 203 (S2).

<Pressure Adjusting Step (S3), and Temperature Increasing Step (S4)>

Subsequently, the pressure in the processing chamber 201 is controlled to be a prescribed processing pressure by the pressure adjuster (APC) 262 (S3). In addition, power supplied to the heater 206 is adjusted, and a surface temperature of the wafer 200 is controlled to be a prescribed processing temperature (S4).

Note that in the substrate loading step (S1), the substrate placement step (S2), the pressure adjusting step (S3), and the temperature increasing step (S4), by closing the open/close valves vs3, vb3, vt3, vo3 and opening the open/close valves vs4, vb4, vt4, vo4, while operating the vacuum pump 264, the Ar gas is always flown into the processing chamber 201 (idle). Thus, it is possible to suppress adhesion of particles onto the wafer 200.

In parallel to the steps S1 to S4, the source gas (called a first source gas hereunder) obtained by vaporizing the first liquid source (organic metal liquid source containing Sr) is generated (preliminarily vaporized) (Set up). Namely, the open/close valve vs1, is opened, with the open/close valve vs2 closed, and the pressurized gas is supplied from the first pressurized gas supply pipe 237s, and the first liquid staring material is fed (supplied) to the vaporizer 229s from the first liquid source supply source 220s, and the first liquid source is vaporized by the vaporizer 229s to generate the first source gas. In this preliminary vaporization step, by opening the open/close valve vs5, with the open/close valve vs3 closed while operating the vacuum pump 264, the first source gas can bypass the processing chamber 201 without being supplied into the processing chamber 201 and is exhausted.

Also, in parallel to the steps of S1 to S4, preferably, the ozone gas, being the oxidant, is generated (Set up). Namely, the oxygen gas is supplied to the ozonizer 229o from the oxygen gas supply source 230o, and the ozone gas is generated by the ozonizer 229o. At this time, by opening the open/close valve vo5, with the open/close valve vo3 closed, while operating the vacuum pump 264, the ozone gas is not supplied into the processing chamber to bypass the processing chamber 201 and is exhausted.

A prescribed time is required for stably generating the first source gas by the vaporizer 229s, or for stably generating the ozone gas by the ozonizer 229o. Therefore, in this embodiment, by previously generating the first source gas or the ozone gas and switching opening/closing of the open/close valves vs3, vs5, vo3, vo5, the flow passage of the first source gas or the ozone gas is switched. As a result, by switching the open/close valve, stable supply of the firs source gas or the ozone gas into the processing chamber 201 can be speedily started or stopped, and this is preferable. Simultaneously with this preliminary vaporizing step, the open/close valve vt2 is opened, and cleaning inside of the liquid source flow passage 21t of the vaporizer 229t is started. Note that details of the cleaning method will be described later.

<First Step (S5)>

Subsequently, the first step (S5) is executed. In the first step (S5), the STO (SrTiO3) film, being the metal oxide film, containing strontium and titanium is formed at a first temperature allowing no oxidization of the metal thin film to occur and allowing the metal oxide film to be set in an amorphous state. Specifically, power supplied to the heater 206 is adjusted, and the ALD step (S51) using first source gas as will be described later and the ALD step (S52) using the third source gas are set as one cycle while controlling the surface temperature of the wafer 200 to become the aforementioned first temperature, and by repeating this cycle prescribed number of times, the STO film of a desired film thickness is formed on the ruthenium thin film.

Note that the inventors of the present invention found a point that although the STO film is crystallized when the processing temperature (surface temperature of the wafer 200 at the time of film deposition) is set at 400° C., it does not crystallize when the processing temperature is set at 375° C. Namely, it appears that temperature (point) at which the STO film is crystallized exists between 375 to 400° C., and it appears that by at least setting the processing temperature at 375° C. or less, the STO film in an amorphous state can be formed. Also, it is found that although the base ruthenium thin film is oxidized when the processing temperature is set at 375° C., the oxidization can be suppressed when the processing temperature is set at 350° C., and when the processing temperature is set at 300° C. or less, the oxidization can be surely suppressed. However, when the processing temperature is set in a range from 300° C. to 350° C., the base ruthenium thin film is sometimes oxidized and is sometimes not oxidized, and whether or not the oxidization can be suppressed is unstable in some cases.

The ALD step (S51) using the first staring material gas and the ALD step (S52) using the third source gas will be sequentially described.

In the ALD step (S51) using the first source gas, the open/close valves vs4, vs5 are closed and the open/close valves vs3 is opened, with the vacuum pump 264 operated, supply of the first source gas into the processing chamber 201 is started (Sr). The first source gas is dispersed by the shower head 240 and is uniformly supplied onto the wafer 200 in the processing chamber 201, so that gas molecules of the first source gas are adsorbed on the wafer 200. Extra first source gas is flown through the exhaust duct 259, and is exhausted to the exhaust port 260. Note that at the time of supplying the first source gas into the processing chamber 201, preferably the open/close valves vb4, vt4, vo4 are remained opened, and the Ar gas is always flown into the processing chamber 201.

After the open/close valve vs3 is opened and supply of the first source gas is started, and after elapse of a prescribed time, by closing the open/close valve vs and opening the open/close valves vs4, vs5, supply of the first source gas into the processing chamber 201 is stopped. Also, simultaneously, by closing the open/close valve vs1, supply of the first liquid source to the vaporizer 229s is also stopped.

Here, after the open/close valve vs3 is closed and supply of the first source gas is stopped, the open/close valves vs4, vb4, vt4, vo4 are remained opened, and the Ar gas is always flown through the processing chamber 201. Thus, the first source gas remained in the processing chamber 201 is removed and the inside of the processing chamber 201 is purged by Ar gas (PS1).

Also, after the open/close valve vs1, is closed and supply of the first liquid source is stopped, cleaning inside of the vaporizer 229s is started (PS1~). Namely, the pressurized gas is supplied from the cleaning liquid pressurized gas supply pipe 237e and by opening the open/close valve vs2, with the open valve vs1, closed, cleaning liquid is supplied into the liquid source flow passage 21s of the vaporizer 229s, and the inside of the liquid source flow passage 21s is cleaned. At this time, the open/close valves vs1, vs3 are set to be Close, and the open/close valves vs1, vs5 are set to be Open, and therefore the inside of the liquid source flow passage 21s is cleaned by the cleaning liquid supplied into the liquid source flow passage 21s, and thereafter the cleaning liquid is supplied into the vaporizer 20s and is vaporized thereby. At this time, the first liquid source and the solvent remained in the liquid source flow passage 21s are also supplied into the vaporizing chamber 20s together and is vaporized thereby. Then, the vaporized cleaning liquid, the first liquid source, and the solvent are passed through the first source gas supply pipe 213s and bypass the processing chamber 201, without being supplied into the processing chamber 201, and is exhausted from the vent pipe 215s. Note that cleaning inside of the liquid source flow passage 21s of the vaporizer 229s is, for example, continued until start of the supply of the first liquid source to the vaporizer 229s next time (from S52 to Ti).

When purge inside of the processing chamber 201 is completed, the open/close valves vo4, vo5 are closed, and the open/close valve vo3 is opened, to start the supply of the ozone gas into the processing chamber 201 (OxS). The ozone gas is dispersed by the shower head 240 and is uniformly supplied onto the wafer 200 in the processing chamber 201, and reacts with the gas molecules of the first source gas adsorbed on the surfaces of the wafer 200, to generate the SrO film on the wafer 200 as a thin film containing Sr element. Extra ozone gas and reaction by-products are flown through the exhaust duct 259, and exhausted to the exhaust port 260. Note that at the time of supplying the ozone gas into the processing chamber 201, preferably the open/close valves vs4, vb4, vt4 remain opened, so as to urge diffusion of the ozone gas in the processing chamber 201, and the Ar gas is always flown through the processing chamber 201.

After the open/close valve vo3 is opened and supply of the ozone gas is started, and after elapse of a prescribed time, by closing the open/close valve vo3 and opening the open/close valves vo4, vo5, supply of the ozone gas into the processing chamber 201 is stopped.

After the open/close valve vo3 is closed and supply of the ozone gas is stopped, the open/close valves vs4, vb4, vt4 vo4 remain opened, and Ar gas is always flown through the processing chamber 201. Thus, the ozone gas and the reaction by-products remained in the processing chamber 201 are removed and the inside of the processing chamber 201 is purged by the Ar gas (PS2).

Note that in the ALD step (S51) using the first source gas, the source gas (called the third source gas) obtained by vaporizing the third liquid source (organic metal liquid source containing Ti element) is previously generated (preliminarily vaporized) (PS1~). Namely, the open/close valve vt2 is closed and the open/close valve vt1 is opened, and the pressurized gas is supplied from the third pressurized gas supply pipe 237t, to supply the third liquid source to the vaporizer 229t from the third liquid source supply source 220t and vaporize the third liquid source by the vaporizer 229t, then generate the third source. In the ALD step (S51) using the first source gas, by opening the open/close valve vt5, with the open/close valve vt3 closed, while operating the vacuum pump 264, the third source gas bypasses the processing chamber 201 without being supplied into the processing chamber 201 and is exhausted. Thus, the third source gas is previously generated and by switching opening/closing of the open/close valves vt3, vt5 in the ALD step (S52) using the third source gas as will be described later, the flow passage of the third source gas is switched. Thus, in the ALD step (S52) using the third source gas, stable supply of the third source gas into the processing chamber 201 can be speedily started or stopped, and this is preferable.

Subsequently, the ALD step (S52) using the third source gas is executed.

In the ALD step (S52) using the third source gas, the open/close valves vt4, vt5 are closed and the open/close valve vt3 is opened, while operating the vacuum pump 264, and supply of the third source gas into the processing chamber 201 is started (Ti). The third source gas is dispersed by the shower head 240 and is uniformly supplied onto the wafer 200 in the processing chamber 201, and the gas molecules of the third staring material gas are adsorbed on the surfaces of the wafer 200. The extra third source gas is flown through the exhaust duct 259 and is exhausted to the exhaust port 260. Note that at the time of supplying the third starting gas into the processing chamber 201, preferably the open/close valves vs4, vg4, vo4 remain opened so as to urge diffusion of the third source gas in the processing chamber 201, and the Ar gas is always flown through the processing chamber 201.

After the open/close valve vt3 is opened and supply of the third source gas is started, and after elapse of a prescribed time, the open/close valve vt3 is closed and the open/close valves vt4, vt5 are opened, to stop supply of the third source gas into the processing chamber 201 is stopped. Also, simultaneously, the open/close valve vt1 is closed, and supply of the third liquid source to the vaporizer 229t is also stopped.

Here, after the open/close valve vt3 is closed and supply of the third source gas is stopped, Ar gas is always flown through the processing chamber 201, with the open/close valves vs4, vb4, vt4, vo4 opened. Thus, the third source gas remained in the processing chamber 201 is removed, and the inside of the processing chamber 201 is purged by Ar gas (PT1).

In addition, after the open/close valve vt1 is closed and supply of the third liquid source is stopped, cleaning inside of the vaporizer 229t is started (PT1~). Namely, the pressurized gas is supplied from the cleaning liquid pressurized gas supply pipe 237e and the open/close valve vt2 is opened, with the open/close valve vt1 closed, and the cleaning liquid is supplied into the liquid source flow passage 21t of the vaporizer 229t, to clean the inside of the liquid source flow passage 21t. At this time, the open/close valves vt1, vt3 are set to be Close, and the open/close valves vt2, vt4 are set to be Open, and therefore the inside of the liquid source flow passage 21t is cleaned by the cleaning liquid supplied into the liquid source flow passage, and thereafter the cleaning liquid is supplied into the vaporizing chamber 20t and is vaporized thereby. At this time, the third liquid source and the solvent remained in the liquid source flow passage 21t are supplied into the vaporizing chamber 20s together and vaporized thereby. Then, the vaporized cleaning liquid, the third liquid source, and the solvent are passed through the third source gas supply pipe 213t and bypass the processing chamber 201, and exhausted from the vent pipe 215t. Note that cleaning inside of the liquid source flow passage 211t is continued, for example, until start of supply of the third liquid source to the vaporizer 229t next time (from S51 to Sr).

When purge inside of the processing chamber 201 is completed, the open/close valves vo4, vo5 are closed, and the open/close valve vo3 is opened, to start supply of the ozone gas into the processing chamber 201 (OxT). The ozone gas is dispersed by the shower head 240 and is uniformly supplied onto the wafer 200 in the processing chamber 201, then reacts with the gas molecules of the third source gas adsorbed on the surface of the wafer 200, to generate a TiO2 film, being a thin film, containing Ti element on the wafer 200. Extra ozone gas and the reaction by-product are flown into the exhaust duct 259, and is exhausted to the exhaust port 260. Note that at the time of supplying the ozone gas into the processing chamber 201, preferably the open/close valves vs4, vb4, vt4 are remained opened so as to prevent intrusion of the ozone gas into the first starting gas supply pipe 213s, the second source gas supply pipe 213b, and the third starting gas supply pipe 213t and urge the diffusion of the ozone gas in the processing chamber 201, so that the Ar gas is always flown through the processing chamber 201.

After the open/close valve vo3 is opened and supply of the ozone gas is started, and after elapse of a prescribed time, the open/close valve vo3 is closed, and the open/close valves vo4, vo5 are opened, to stop the supply of the ozone gas into the processing chamber 201.

After the open/close valve vo3 is closed and supply of the ozone gas is stopped, Ar gas is always flow through the processing chamber 201, with the open/close valves vs4, vb4, vt4, vo4 opened. Thus, the ozone gas and the reaction by-products remained in the processing chamber 201 are removed, and the inside of the processing chamber 201 is purged by Ar gas (PT2).

The aforementioned ALD step using the first source gas (S51) and the ALD step using the third source gas (S52) are set as one cycle, and by repeating this cycle prescribed number of times, a STO film of a desired film thickness, namely, a $SrTiO_3$ thin film, is formed on the a ruthenium thin film.

Note that when the STO film, for example, is formed, the processing conditions of the wafer 200 in the first step (S5) are as follows:

processing temperature (first temperature): 200 to 350° C., preferably 200 to 300° C.

processing pressure: 10 to 1000 Pa, preferably 10 to 500 Pa, first liquid source ($Sr(C_{14}O_4H_{25})_2$ (abbreviated as $Sr(METHOD)_2$) 0.1 mol/L ECH dilution) supply flow rate: 0.01 to 0.5 cc/min, third liquid source (Ti $(C_6O_2H_{11})$ $(C_{11}O_2H_{19})_2$ (abbreviated as $Ti(MPD)$ $(THD)_2$) 0.1 mol/L ECH dilution) supply flow rate: 0.01 to 0.5 cc/min, oxidant (ozone gas) supply flow rate: 500 to 2000 sccm (ozone concentration 20 to 200 $g/Nm^3$)

cleaning liquid (ECH) supply flow rate: 0.05 to 0.5 cc/min, film thickness: 3 to 5 nm (30 to 50 Å)

number of cycles: 60 to 100 cycles. By maintaining each processing condition to be constant at a certain value in each range, the STO film in an amorphous state is formed on the ruthenium thin film formed on the wafer 200.

Note that when the processing temperature is below 200° C., an adsorption mechanism of adsorption of the gas molecules of the source gas on the base ruthenium thin film is a physical adsorption. Therefore, the formed STO film is easily peeled off from the base ruthenium thin film. Moreover, probability of $O_3$ decomposition (probability of the reaction between the ozone gas and the gas molecules of the source gas adsorbed on the surface of the wafer 200) is reduced, and a film deposition rate is also reduced in some cases. Meanwhile, when the processing temperature exceeds 350° C., the base ruthenium thin film is easily oxidized. Meanwhile, when the processing temperature is set at 200 to 350° C., the adsorption mechanism of adsorption of the gas molecules of the source gas on the base ruthenium thin film is a chemical adsorption. Therefore, it is possible to suppress a state in which the formed STO film is easily peeled off from the base ruthenium thin film. In addition, when the processing temperature is set at 200 to 350° C., it is possible to suppress reduction in probability of the $O_3$ decomposition, thus making it possible to suppress decrease of the film deposition rate and suppress oxidization of the base ruthenium thin film. Further, in this temperature range, the STO film in the amorphous state can be formed, and the formed STO film can be functioned as an oxygen transmission barrier.

However, when the processing temperature is set at 300° C. to 350° C. in the first step (S5), the base ruthenium thin film is sometimes oxidized and is sometimes not oxidized, and whether or not oxidization can he suppressed is unstable. Meanwhile, when the processing temperature is set at 300° C. or less, oxidization of the base ruthenium thin film can be further surely suppressed. Namely, when the processing temperature is set at 200 to 300° C., it is possible to suppress the state in which the formed STO film in the amorphous state is easily peeled off from the base ruthenium thin film, thus making it possible to suppress decrease of the film deposition rate and further surely suppress the oxidization of the base ruthenium thin film.

In addition, when the processing pressure is below 10 Pa, adsorption of the source gas on the base ruthenium thin film is inhibited, thus reducing amount of an adsorption seed on the base ruthenium thin film, namely, amount of the gas molecules of the source gas adsorbed on the base ruthenium thin film, and it becomes difficult to increase the film deposition rate. Meanwhile, when the processing pressure exceeds 1000 Pa, although depending on a partial pressure, re-liquefaction of the source gas occurs in some cases. Meanwhile, when the processing pressure is set at 10 to 1000 Pa, adsorption of the gas molecules of the source gas on the base ruthenium thin film can be accelerated, thus making it possible to increase the film deposition rate and to suppress the re-liquefaction of the source gas. Note that when the processing pressure is set at 500 Pa or less, it is further possible to suppress the occurrence of the re-liquefaction of the source gas.

In addition, when the supply flow rate of the liquid source is below 0.01 cc/min, it becomes difficult to increase the film deposition rate. Meanwhile, as the supply flow rate of the liquid source becomes larger, it becomes more difficult to vaporize the liquid source. Accordingly, in a case of processing a sheet-feeding type substrate for processing one sheet of wafer 200 at one time, preferably the supply flow rate of the liquid source is set at about 0.01 to 0.5 cc/min, and in a case of processing a batch type substrate for processing a plurality of wafer 200 at one time, preferably the supply flow rate of the liquid source is set at about 0.01 to 2 cc/min.

In addition, when the supply flow rate of the cleaning liquid is below 0.01 cc/min, cleaning effects of the vaporizers 229s, 229b, 229t are reduced, and suppressing effects against clogs of the vaporizers 229s, 229b, 229t become insufficient, or time required for cleaning the vaporizers 229s, 229b, 229t is prolonged in some cases. Meanwhile, as the supply flow rate of the cleaning liquid becomes larger, it becomes further difficult to vaporize the cleaning liquid. Accordingly, in a case of processing the sheet-feeding type substrate for processing one sheet of wafer 200 at one time, the supply flow rate of the cleaning liquid is preferably set at about 0.01 to 0.5 cc/min, and in a case of processing the batch-type substrate for processing a plurality of wafer 200 at one time, the supply flow rate of the cleaning liquid is preferably set at about 0.1 to 2 cc/min.

In addition, when the film thickness of the formed STO film in the amorphous state is under 3 nm, this is an excessively thin film, and therefore a function as an oxygen transmission barrier is reduced in some cases. Also, in a case of the excessively thin film, it becomes difficult to densify the STO film in a densifying step (S5a) as will be described later. Meanwhile, when the film thickness exceeds 5 nm, it becomes difficult to crystallize the STO film in a crystallizing step (S7) as will be described later. Meanwhile, when the film thickness is set at 3 to 5 nm, the formed STO film can be sufficiently functioned as the oxygen transmission barrier, thus making it possible to sufficiently densify the STO film in the densifying step (S5a) as will be described later and sufficiently crystallize the STO film in the crystallizing step (S7) as will be described later.

In the first step (S5), the surface temperature of the wafer 200 is set at the aforementioned first temperature, and therefore the STO film in the amorphous state can be formed as described above, and oxidization of the base ruthenium thin film can be suppressed. Note that in this embodiment, the same substance (ECH) is used as the solvent for diluting each liquid source and the cleaning liquid.

<Second Step (S6)>

Subsequently, the second step (S6) is executed. In the second step (S6), the STO film as the metal oxide film containing, for example, strontium and titanium, is formed on the STO film formed in the first step (S5), at a second temperature exceeding (beyond) the first temperature, up to a target film thickness. Specifically, power supplied to the heater 206 is adjusted, and while controlling the surface temperature of the wafer 200 to be the aforementioned second temperature, the ALD step using the first source gas (S61) and the ALD step using the third source gas (S62) are set as one cycle, and by repeating this cycle prescribed number of times, the STO film of a desired film thickness is formed on the STO film formed in the first step. Note that a sequence of the ALD step using the first source gas (S61) and the ALD step using the third source gas (S62) is the same as the sequence of the aforementioned ALD step using the first source gas (S51) and the ALD step using the third source gas (S52).

As described above, the STO film formed in the first step (S5) needs to be set in the amorphous state. Meanwhile, the STO film formed in the second step (S6) may be set in the amorphous state or may be set in a polycrystalline state. However, the polycrystalline state is more preferable. After the STO film is formed in the first step (S5) and the second step (S6), an overall STO film is subjected to annealing and crystallized in the crystallizing step (S7) as will be described later. However, if the STO film in the polycrystalline state is formed in the second step (S6), an overall STO film can be easily crystallized in the crystallizing step (S7) In this case, it is preferable for example, that the STO film in the amorphous state is formed, with the processing temperature (first temperature) set at 300° C. in the first step (S5), and the STO film in the polycrystalline state is formed, with the processing temperature (second temperature) set at 400° C. in the second step (S6).

Note that when the STO film in the amorphous state is formed in the second step (S6), it is preferable to set the processing temperature (second temperature) in the second step (S6) higher than the processing temperature (first temperature) in the first step (S5). By setting the processing temperature (second temperature) in the second step (S6) higher than the processing temperature (first temperature) in the first step (S5), a relatively easily crystallized STO film in the amorphous state can be formed in the crystallizing step (S7) as will be described later. In this case, it is preferable for example, that the STO film in the amorphous state is formed, with the processing temperature (first temperature) in the first step (S5) set at 300° C., and the STO film in the amorphous state is formed, with the processing temperature (second temperature) in the second step (S6) set ate 350° C.

Thus, in the second step (S6), it is preferable to form the STO film in the amorphous state which is more easily crystallized than the STO film in the amorphous state formed in the first step (S5) (crystallized at a temperature lower than the STO film in the amorphous state formed in the first step (S5)). Namely, it is preferable to set the second temperature higher than the first temperature, and although the second temperature can be set to be the same as the first temperature, it can be preferably set higher than the first temperature.

Also, it is preferable to form the STO film in the second step (S6), with the film thickness set thicker than that of the STO film formed in the first step (S5). Namely, it is preferable to form the STO film in the first step (S5), with the film thickness set thinner, and form the STO film in the second step (S6), with the film thickness set thicker.

Note that for example, when the STO film is formed, the processing conditions of the wafer 200 in the second step (S6) are as follows:

processing temperature (second temperature): 300 to 400° C., preferably 350 to 400° C., processing pressure: 10 to 1000 Pa, preferably 10 to 500 Pa, first liquid source $(Sr(C_{14}O_4H_{25})_2$ (abbreviated as $Sr(METHOD)_2$) 0.1 mol/L ECH dilution) supply flow rate: 0.01 to 0.5 cc/min, third liquid source $(Ti(C_6O_2H_{11})(C_{11}O_2H_{19})_2$ (abbreviated as $Ti(MPD)(THD)_2$) 0.1 mol/L ECH dilution) supply flow rate: 0.01 to 0.5 cc/min, oxidant (ozone gas) supply flow rate: 500 to 2000 sccm (ozone concentration 20 to 200 g/Nm$^3$), cleaning liquid (ECH) supply flow rate: 0.05 to 0.5 cc/min, film thickness: 12 to 15 nm (120 to 150 Å)

number of cycles: 240 to 300 cycles. By maintaining each processing condition to be constant at a certain value in each range, the STO film is further formed on the STO film in the amorphous state formed in the first step (S5).

Note that conditions are different between the first step (S5) and the second step (S6), in only processing temperature and other conditions such as processing pressure is the same as conditions of the first step (S5). When the processing temperature is below 300° C. in the second step (S6), the film deposition rate is decreased in some cases, and the STO film in the amorphous state is formed in some cases, which is hardly crystallized even if the crystallizing step (S7) as will be described later is executed. Meanwhile, when the processing temperature exceeds 400° C., the source gas is self-decomposed and the ALD film deposition can not be appropriately performed in some cases. Meanwhile, when the processing temperature is set at 300 to 400° C., decrease of the film deposition rate can be suppressed, thus making it possible to suppress the formation of the STO film in the amorphous state which is hardly crystallized and the ALD film deposition can be appropriately performed. Note that even in a range from 300 to 400° C., higher film deposition rate can be obtained as the processing temperature is set higher, thus making it possible to form the STO film in the amorphous state that is easily crystallized and the STO film in the polycrystalline state that is crystallized, and a film quality of the STO film can be improved. Therefore, it is more preferable to set the processing temperature at 350 to 400° C.

Note that at the time of forming the STO film in the second step (S6), oxidization of the base ruthenium thin film is suppressed, because the STO film in the amorphous state previously formed in the first step (S5) functions as a barrier for suppressing transmission of oxygen. Here, in a case of the polycrystalline state of the STO film formed in the first step (S5), it can be so considered that oxygen is transmitted through a crystal grain boundary of the STO film formed in the first step (S5) at the time of forming the STO film in the second step (S6), and the base ruthenium thin film is oxidized. Meanwhile, in a case of the amorphous state of the STO film formed in the first step (S5), no crystal grain boundary exists in the STO film in the amorphous state. Therefore, pass, i.e. transmission of oxygen is not formed, and at the time of forming the STO film in the second step (S6), transmission of oxygen can be blocked and oxidization of the base ruthenium thin film can be suppressed. Note that according to this embodiment, the same substance (ECH) is used as the solvent for diluting each liquid source, and the cleaning liquid.

<Crystallizing Step (S7)>

Subsequently, power supplied to the heater 206 is adjusted, and the overall STO film formed in the first step (S5) and the second step (S6) is subjected to annealing and is crystallized.

Note that for example, when the STO film is crystallized, the processing conditions of the wafer 200 in the crystallizing step (S7) are as follows:
processing temperature: 500 to 600 C,
processing pressure: 50 to 2000 Pa
processing gas: Ar or $N_2$ supply flow rate: 0.5 to 5000 sccm,
processing time 1 to 60 minutes. By maintaining each processing condition to be constant at a certain value in each range, the overall STO film formed in the first step (S5) and the second step (S6) is crystallized. As a result, the dielectric constant of the overall STO film is increased.

<Substrate Unloading Step (S8)>

Thereafter, the wafer 200 after being formed with a thin film of a prescribed film thickness is unloaded from the processing chamber 201 into the transfer chamber 271, and the substrate processing step according to this embodiment is completed.

Note that when the forming step of the metal oxide film is performed by the ALD method, the processing temperature (the first temperature and the second temperature) is controlled to become a temperature zone not allowing self-decomposition of the source gas to occur. In this case, when each source gas is supplied in the ALD steps (S51, 52, 61, 62) using each source gas, the source gas is adsorbed on the wafer 200. In addition, when the ozone gas is supplied, the thin film of about under 1 atomic layer (under 1 Å) is formed on the wafer 200 by reaction between the source gas molecules and the ozone gas adsorbed on the wafer 200. Note that at this time, impurities such as C, H mixed in the thin film by ozone gas can be desorbed.

(3) Effects According to this Embodiment

According to this embodiment, one or more effects as shown below can be exhibited.

According to this embodiment, the STO film is previously formed in the first step (S5) before forming the STO film in the second step (S6). The STO film formed in the first step (S5) functions as a barrier for suppressing transmission of oxygen, and therefore when the STO film is formed at the second temperature (for example, 300 to 400° C., preferably 350 to 400° C.) in the second step (S6), oxygen containing gas is hardly brought into contact with the base ruthenium thin film, thus making it possible to suppress oxidization of the ruthenium thin film.

In addition, in the first step (S5) according to this embodiment, the STO film is formed on the ruthenium thin film at the first temperature (for example, 200 to 350° C., preferably 200 to 300° C.) allowing the STO film to be set in the amorphous state, being the temperature not allowing oxidization of the base ruthenium thin film to occur. By forming the STO film in such a temperature range, oxidization of the base ruthenium thin film can be suppressed.

In addition, according to this embodiment, after the STO film is formed at the first temperature, the STO film is formed up to a target film thickness, at the second temperature (300 to 400° C., preferably 350 to 400° C.) exceeding (beyond) the first temperature, after forming the STO film at the first temperature. By forming the STO film in this temperature range after forming the STO film at the first temperature, a forming speed of the STO film can be speeded up, while suppressing the oxidization of the base ruthenium thin film, and productivity of substrate processing can be improved.

In addition, according to this embodiment, by executing the crystallizing step (S7) after forming the STO film up to a target film thickness at the second temperature, the overall STO film formed in the first step (S5) and the second step (S6) is subjected to annealing and is crystallized. As a result, the dielectric constant of the STO film can be increased. Note that according to this embodiment, explanation is given for an example in which formation of the STO film in the first step (S5) and the second step (S6) and annealing of the STO film in the crystallizing step (S7) are continuously performed in the same processing chamber 201. However, the crystallizing step (S7) may be performed in the processing chamber different from the processing chamber 201 in which the first step (S5) and the second step (S6) are performed, namely in the processing chamber for annealing.

<Second Embodiment of the Present Invention>

In the aforementioned embodiment, the STO film in the amorphous state formed at the first temperature functions as a barrier for suppressing the transmission of oxygen. Meanwhile, according to this embodiment, the STO film in the amorphous state formed at the first temperature is further subjected to annealing, and while maintaining this amorphous state, the STO film is densified. Thus, density of the STO film can be increased, and a barrier effect for suppressing the transmission of oxygen in the STO film in the amorphous state can be further increased. This embodiment will be explained hereunder, with reference to FIG. 6B.

As shown in FIG. 6B, according to this embodiment, a different point from the aforementioned embodiment is that this embodiment further includes the densifying step (S5a) of densifying the STO film by applying annealing thereto, while maintaining the amorphous state. Namely, in the first step (S5), the ALD step using the first source (S51) gas and the ALD step using the third source gas (S52) are set as one cycle, and by repeating this cycle prescribed number of times, the STO film of a prescribed film thickness is formed, and thereafter the power supplied to the heater 206 is adjusted to execute the densifying step (S5a) for the STO film, and after completing the densifying step (S5a), the second step (S6) is executed, and this point is different from the aforementioned embodiment. Other points are the same as the aforementioned embodiment.

Note that for example, when the STO film is densified, the processing conditions of the wafer 200 in the densifying step (S5a) are as follows:
processing temperature: 400 to 600° C.,
processing pressure: 50 to 2000 Pa,
processing gas: Ar or $N_2$ supply flow rate: 0.5 to 5000 sccm,
processing time: 1 to 10 minutes.

By maintaining each processing condition to be constant at a certain value in each range, the STO film in the amorphous state is densified, while maintaining the amorphous state.

Note that when the processing temperature is below 400° C., the STO film in the amorphous state is hardly densified. Meanwhile, when the processing temperature exceeds 600° C., the STO film in the amorphous state is easily crystallized, and the base ruthenium thin film is easily oxidized. Meanwhile, when the processing temperature is set at 400 to 600° C., the STO film in the amorphous state can be sufficiently densified in the amorphous state without crystallizing the STO film in the amorhpus state, thus making it possible to suppress the oxidization of the base ruthenium thin film. Note that by densifying the STO film in the amorphous state, distance between molecules constituting the STO film in the amorphous state can be shortened, thus making it possible to further increase the barrier effect for suppressing the transmission of oxygen. In addition, by this densification, the overall STO film can be made easy to crystallize in the crystallizing step (S7) as will be described later.

In addition, when the processing pressure is too low, degassing occurs easily from the formed STO film, and a roughened surface is easily caused on the STO film surface. Meanwhile, when the processing pressure is set at 50 to 2000 Pa, occurrence of degassing from the formed STO film can be suppressed, and also occurrence of roughened surface on the STO film surface can be suppressed.

Also, when the processing time is too short, the STO film in the amorphous state is hardly densified sufficiently. For example, if the processing time is set under one minute when the processing temperature is set at 400 to 600° C., densification of the STO film in the amorphous state is insufficient in some cases. Meanwhile, if the processing time is too long, the STO film in the amorphous state is easily crystallized and the base ruthenium thin film is easily oxidized. For example, if the processing time exceeds 10 minutes when the processing temperature is set at 400 to 600° C., the STO film in the amorphous state is crystallized, and does not function as an oxygen transmitting barrier. Therefore, the base ruthenium thin film is easily oxidized. Meanwhile, if the processing time is set at 1 to 10 minutes when the processing temperature is set at 400 to 600° C., the STO film in the amorphous state can be sufficiently densified without being crystallized, and the oxidization of the base ruthenium thin film can be sufficiently suppressed.

Note that even in a case of setting an annealing temperature in the densifying step (S5a) to be the same temperature as the annealing temperature in the crystallizing step (S7), by adjusting the annealing time, specifically by making the annealing time in the densifying step (S5a) shorter than the annealing time in the crystallizing step (S7), the STO film can be densified without being crystallized, while maintaining the amorphous state.

As described above, the STO film previously formed at the first temperature functions as a barrier for suppressing transmission of oxygen at the time of forming the STO film at the second temperature. However, according to this embodiment, further densifying step (S5a) is executed to the STO film previously formed at the first temperature, to densify the STO film in the amorphous state, thus making it possible to further increase the barrier effect for suppressing the transmission of oxygen. As a result, oxidization of the base ruthenium thin film can be further suppressed. Note that according to this embodiment, explanation has been given for an example of continuously performing formation of the STO film by repeating the ALD step using the first source gas (S51) and the ALD step using the third source gas (S52), and the densifying step (S5a) in the same processing chamber 201. However, the densifying step (S5a) may be performed in the processing chamber different from the processing chamber 201 for performing formation of the STO film, namely, in the processing chamber for annealing.

Explanation will be given for an example of depositing the STO film on the ruthenium thin film by a flow of the second embodiment, while using the substrate processing apparatus explained in the first embodiment. Note that the processing conditions of each step in this example are as follows.

First, in the process of repeating the ALD step using the first source gas (S51) and the ALD step using the third source gas (S52) in the step 1 (S5), the processing temperature is set at 275° C., the processing pressure is set at 10 to 500 Pa, and the film thickness is set at 5 nm (50 Å), and under these conditions, the STO film in the amorphous state is formed on the ruthenium thin film.

In the densifying step (S5a), the processing temperature is set at 580° C., the processing pressure is set at 50 to 2000 Pa processing gas is set at Ar, the processing gas supply flow rate is set at 0.5 to 5000 sccm, and the processing time is set at two minutes, and under these conditions, the STO film is formed and this STO film is densified while maintaining the amorphous state.

In the step in which the ALD step using the first source gas (S61) and the ALD step using the third source gas are repeated in step 2 (S6), the processing conditions are set as processing temperature: 400° C., processing pressure: 10 to 500 Pa, film thickness: 5 nm (50 Å), and the STO film in a polycrystalline state is formed on the densified STO film. Note that a total thickness of the STO films formed in the step 1 (S5) and the step 2 (S6) is 10 nm.

In the crystallizing step (S7), the processing conditions are set as processing temperature: 580° C., processing pressure: 50 to 2000 Pa, processing gas: Ar, processing gas supply flow rate: 0.5 to 5000 sccm, processing time: 5 minutes, and the STO film formed in the step 1 (S5) and step 2 (S6) is crystallized.

As a result of the aforementioned film deposition test, it is confirmed that the base ruthenium thin film is not oxidized in the method of this example. In addition, by executing the crystallizing step (S7), it is confirmed that the STO film formed in two stages of the step 1 (S5) and step 2 (S6) is crystallized to be one layer film.

<Third Embodiment of the Present Invention>

Figure 3:
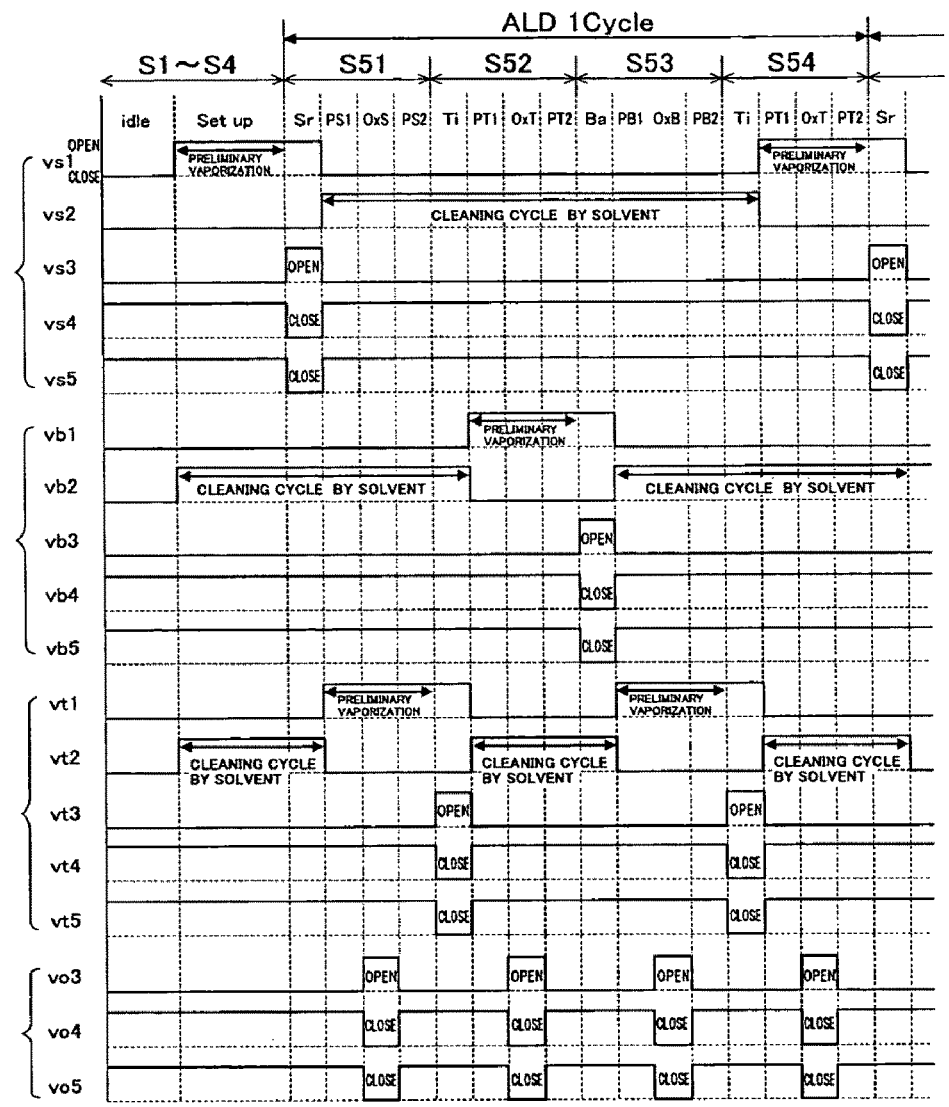
FIG. 3 is a sequence chart showing an opening/closing timing of each valve of the substrate processing apparatus according to other embodiment of the present invention.
Figure 8:
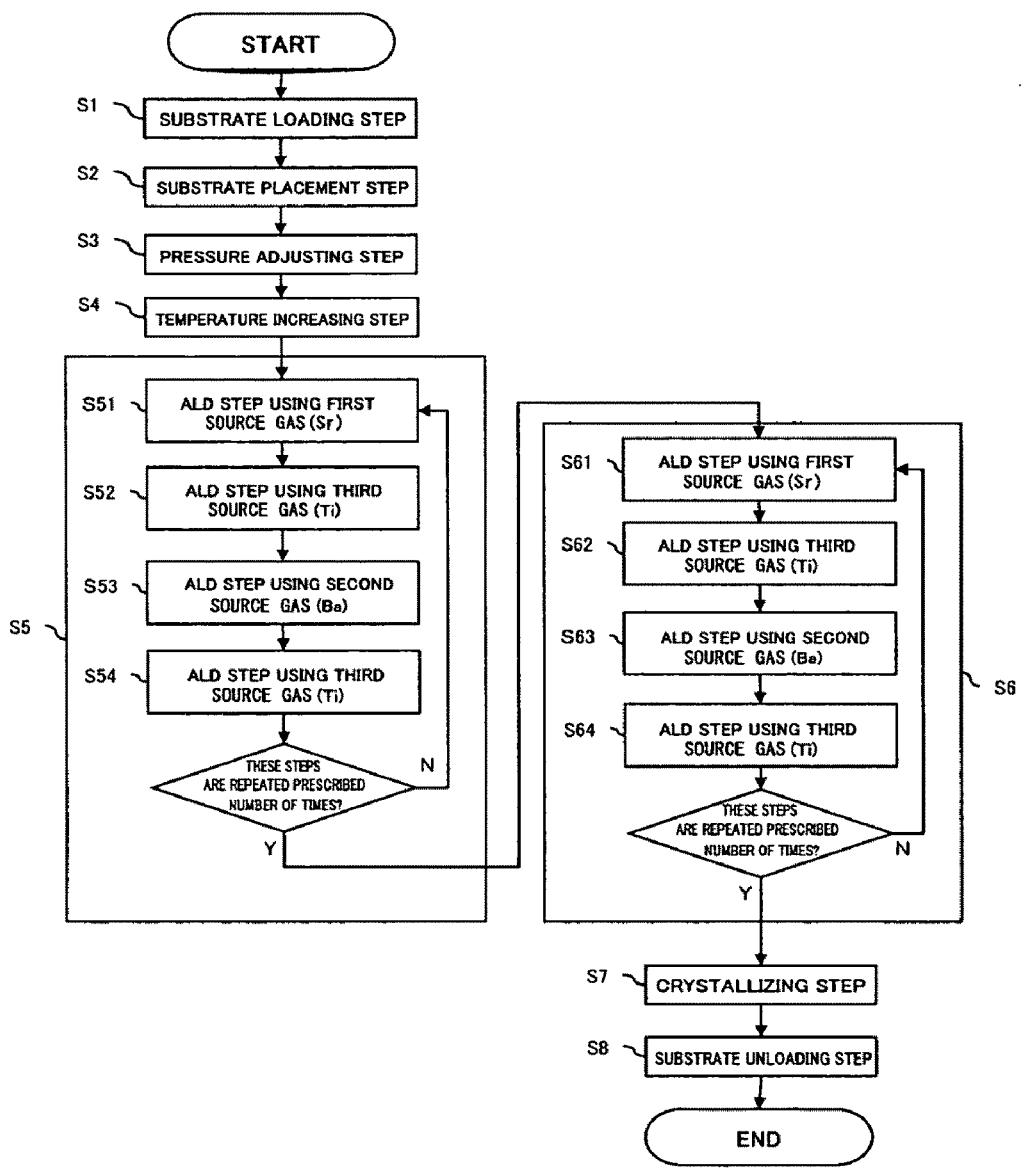
FIG. 8 is a flowchart of the substrate processing steps according to other embodiment of the present invention.

In the above-described embodiments, explanation is given for an example of forming the STO ($SrTiO_3$) film, as a metal oxide film. However, the present invention is not limited to the aforementioned embodiments. Another embodiment will be explained hereunder with reference to FIG. 3 and FIG. 8, such as a case in which a BST((Ba, Sr) $TiO_3$) film is formed as the metal oxide film containing strontium, titanium, and barium. FIG. 8 is a flowchart of the substrate processing step according to another embodiment of the present invention. FIG. 3 is a sequence chart, being a timing chart, showing the opening/closing timing of each valve of the substrate processing apparatus according to another embodiment of the present invention. In this timing chart also, High level shows Open of valve and Low level shows Close of valve. Note that in the explanation given hereunder, each operation constituting the substrate processing apparatus is controlled by the controller 280.

As shown in FIG. 8, in the first step (S5), the ALD step (S51) using the first source gas, the ALD step using the third source gas (S52), the ALD step using the second source gas (S53), the ALD step using the third source gas (S54) are set as one cycle, and by repeating this cycle prescribed number of times, the BST film of a desired film thickness is formed on the ruthenium thin film, and this point is different from the aforementioned embodiments. In addition, in the second step (S6), THE ALD step using the first source gas (S61), the ALD step using the third source gas (S62), the ALD step using the second source gas (S63), the ALD step using the third source gas (S64) are set as one cycle, and by repeating this cycle prescribed number of times, the BST (barium titanate strontium) film of a desired film thickness is formed on the BST film formed in the first step (S5), and this point is different from the aforementioned embodiments. Other points are the same as the aforementioned embodiment. The first step (S5) and the second step (S6) according to this embodiment will be explained hereunder.

<First Step (S5)>

First, the ALD step using the first source gas similar to that of the aforementioned embodiment and the ALD step using the third source gas (S52) are sequentially executed, under control of a temperature so that the surface temperature of the wafer 200 is set at the aforementioned first temperature, by adjusting the power supplied to the heater 206. Note that preliminary vaporization of the first liquid source in the substrate loading step (S1) to the temperature increasing step (S4), and the preliminary vaporization of the third liquid source in the ALD step using the first source gas (S51) are performed in the same way as the aforementioned embodiments. Also, simultaneously with executing the preliminary vaporization of the first liquid source, the open/close valves vb2, vt2 are opened, and cleaning of the inside of the liquid source flow passages 21b, 21t of the vaporizers 229b, 229t is started.

Note that in the ALD step using the third staring material gas (S52), the source gas (called the second source gas hereunder) obtained by vaporizing the second liquid source (organic metal liquid source containing Ba element) is previously generated (preliminarily vaporized) (PT1~). Namely, the open/close valve vb2 is closed and the open/close valve vb1 is opened, and by supplying the pressurized gas from the second pressurized gas supply pipe 237b, the second liquid source is supplied to the vaporizer 229b from the second liquid source supply source 220b, then the second liquid source is vaporized by the vaporizer 229b, and the second source gas is generated. In the ALD step using the third source gas (S52), by opening the open/close valve vb5, with the open/close valve vb3 closed, while operating the vacuum pump 264, the second source gas is not supplied into the processing chamber 201 so as to bypass the processing chamber 201, and is exhausted. Thus, the second source gas is previously generated, and by switching open/close of the open/close valves vb3, vg5 in the ALD step using the second source gas (S53) as will be described later, the flow passage of the second source gas is switched. Thus, in the ALD step using the second source gas, stable supply of the second source gas into the processing chamber 201 can be speedily started or stopped, and this is preferable.

Subsequently, the ALD step using the second source gas (S53) is executed.

In the ALD step using the second source gas (S53), the open/close valve vg4, vb5 are closed and the open/close valve vb3 is opened, while operating the vacuum pump 264, supply of the second source gas into the processing chamber 201 is started (Ba). The second source gas is dispersed by the shower head 240 and is uniformly supplied onto the wafer 200 in the processing chamber 201, and the gas molecules of the second source gas are adsorbed on the surface of the wafer 200. Extra second source gas is flown through the exhaust duct 259, and is exhausted to the exhaust port 260. Note that at the time of supplying the second source gas into the processing chamber 201, in order to prevent intrusion of the second source gas to the first source gas supply pipe 213s, the third source gas supply pipe 213t, the ozone gas supply pipe 213o, preferably the Ar gas is always flown through the processing chamber 201, with the open/close valves vs4, vt4, vo4 opened, so as to urge diffusion of the second source gas in the processing chamber 201, in order.

After the open/close valve vb3 is opened, and supply of the second source gas is started, and after elapse of a prescribed time, the open/close valve vb3 is closed, and the open/close valves vb4, vb5 are opened, to stop the supply of the second source gas into the processing chamber 201. In addition, simultaneously, the open/close valve vb1 is closed, to stop the supply of the second liquid source to the vaporizer 229b.

Here, after the open/close valve vb3 is closed, and the supply of the second source gas is stopped, the Ar gas is always flown through the processing chamber 201, with the open/close valves vs4, vb4, vt4, vo4 opened. Thus, the second source gas remained in the processing chamber 201 is removed, to purge the inside of the processing chamber 201 by Ar gas (PB1).

In addition, after the open/close valve vb1 is closed, and the supply of the second liquid source is stopped, cleaning inside of the vaporizer 229b is started (PB1~). Namely, the pressurized gas is supplied from the cleaning liquid pressurized gas supply pipe 237e, and the open/close valve vb2 is opened, with the open/close valve vb1 closed, and cleaning liquid is supplied into the liquid source flow passage 21b of the vaporizer 229b, to clean the inside of the liquid staring material flow passage 21b. At this time, the open/close valves vb1, vb3 are set to be Open, and the open/close valves vb2, vb5 are set to be Open, and therefore the inside of the liquid source flow passage 21b is cleaned by the cleaning liquid supplied into the liquid source flow passage 21b, and thereafter the cleaning liquid is supplied into the vaporizer 20b to be vaporized. At this time, the second liquid source and the solvent remained in the liquid source flow passage 21b are also supplied into the vaporizer 20b together and vaporized. Then, the vaporized cleaning liquid, second liquid source, and solvent are passed through the second source gas supply pipe 213b, then bypass the processing chamber 201 without being supplied into the processing chamber 201, and exhausted from the vent pipe 215b. Note that cleaning inside of the liquid source flow passage 21b of the vaporizer 229b is continued, for example, until supply of the second liquid source to the vaporizer 229b next time is started (until Ti of S52 next time).

When purge inside of the processing chamber 201 is completed, the open/close valves vo4, vo5 are closed and the open/close valve vo3 is opened, to start supply of the ozone gas into the processing chamber 201 (OxB). The ozone gas is dispersed by the shower head 240, then uniformly supplied onto the wafer 200 in the processing chamber 201, and reacts with the gas molecules of the second source gas adsorbed on the surface of the wafer 200, to generate a BaO film on the wafer 200 as a thin film containing Ba element. Extra ozone gas and the reaction by-product are flown through the exhaust duct 259, and exhausted to the exhaust port 260. Note that in supplying the ozone gas into the processing chamber 201, in order to prevent the intrusion of the ozone gas into the first source gas supply pipe 213s, the second source gas supply pipe 213b, the third source gas supply pipe 213t, preferably the Ar gas is always flown through the processing chamber 201, with the open/close valves vs4, vb4, vt4 closed, so as to urge the diffusion of the ozone gas in the processing chamber 201.

After the open/close valve vo3 is opened, and the supply of the ozone gas is started, and after elapse of a prescribed time, the open/close valve vo3 is closed, and the open/close valves vo4, vo5 are opened, to stop the supply of the ozone gas into the processing chamber 201.

After the open/close valve vo3 is closed, and the supply of the ozone gas is stopped, the Ar gas is always flown through the processing chamber 201, with the open/close valves vs4, vb4, vt4, vo4 opened. Thus, the ozone gas and the reaction by-products remained in the processing chamber 201 are removed, to purge the inside of the processing chamber 201 by Ar gas (PB2).

Note that in the ALD step using the second source gas (S53), the source gas (called the third source gas hereunder) obtained by vaporizing the third liquid source (organic metal liquid source containing Ti element) is previously generated (preliminarily vaporized) (PB1~). Namely, the open/close valve vt2 is closed, and the open/close valve vt1 is opened, and by supplying the pressurized gas from the third pressurized gas supply pipe 237t, the third liquid source is supplied to the vaporizer 229t from the third liquid source supply source 220t, then the third liquid source is vaporized by the vaporizer 229t, to generate the third source gas. In the ALD step using the second source gas (S53), by opening the open/close valve vt5, with the open/close valve vt3 closed, while operating the vacuum pump 264, the third source gas bypasses the processing chamber 201 without being supplied into the processing chamber 201 and exhausted. Thus, the third source gas is previously generated, and by switching open/close of the open/close valves vt3, vt5 in the ALD step using the third source gas (S54) as will be described later, the flow passage of the third source gas is switched. Thus, in the ALD step using the third source gas (S54), stable supply of the third source gas into the processing chamber 201 can be speedily started or stopped, and this is preferable.

Subsequently, the ALD step using the third source gas (S54) is executed, and the $TiO_2$ film, being the thin film containing Ti element, is generated on the wafer 200. Note that the sequence of the ALD step using the third source gas is the same as the sequence of the ALD step using the third source gas (S52).

After the ALD step using the third source gas (S54), the steps S51 to S54 are set as one cycle, and by repeating this cycle prescribed number of times, the BST film of a desired film thickness, namely, the (Ba, Sr) $TiO_3$ thin film is formed on the ruthenium thin film. Note that in the first step (S5), the surface temperature of the wafer 200 is set at the first temperature, and therefore the BST film is set in an amorphous state, and oxidization of the base ruthenium thin film is suppressed.

<Second Step (S6)>

Subsequently, the second step (S6) is executed. In the second step (S6), the BST film, for example, being the metal oxide film containing strontium, titanium, and barium, is formed on the BST film which is formed in the first step (S5), up to a target film thickness at the second temperature exceeding the first temperature. Specifically, while controlling the temperature so that the surface temperature of the wafer 200 is set at the second temperature by adjusting the power supplied to the heater 206, the ALD step using the first source gas (S61), the ALD step using the third source gas (S62), the ALD step using the second source gas (S63), and the ALD step using the third source gas (S64) are set as one cycle, and by repeating this cycle prescribed number of times, the BST film of a desired film thickness is formed on the BST film which is formed in the first step. Note that the sequence of the ALD step using the first source gas (S61), the ALD step using the third source gas (S62), the ALD step using the second source gas (S63), and the ALD step using the third source gas (S64) is the same as the aforementioned sequence of ALD step using the first source gas (S51), the ALD step using the third source gas (S52), the ALD step using the second source gas (S53), and the ALD step using the third source gas (S54). Here, preferably the second temperature is set at the temperature exceeding the first temperature, and may be set at the same temperature as the first temperature. However, preferably it is set at the temperature greater than the first temperature. In addition, the BST film formed in the second step (S6) may be set in the amorphous state. However, preferably it is set in the polycrystalline state. Namely, preferably crystallization is progressed while depositing the film. Further, the BST film formed in the second step (S6) is deposited so as to have a thicker film thickness than that of the BST film formed in the first step (S5). Namely, preferably the BST film is thinly formed in the first step (S5), and the BST film is formed thick in the second step (S6). When the BST film is formed in the second step (S6), the BST film in the amorphous state which is previously formed in the first step (S5) functions as an oxygen transmission barrier. Therefore, oxidization of the base ruthenium thin film is suppressed. Here, when the BST film formed in the first step (S5) is set in the polycrystalline state, it is so considered that oxygen is transmitted through the crystal grain boundary of the BST film formed in the first step (S5) at the time of forming the BST film in the second step (S6), and the base ruthenium thin film is oxidized. Meanwhile, when the BST film formed in the first step (S5) is set in the amorphous state, there is no crystal grain boundary in the BST film in the amorphous state, and therefore the pass for allowing oxygen to transmit is not formed, pass, i.e. transmission of oxygen is not formed, and at the time of forming the STO film in the second step (S6), transmission of oxygen can be blocked and oxidization of the base ruthenium thin film can be suppressed. Note that the aforementioned method of the second embodiment may be applied to this embodiment. Namely, the BST film may be densified, while the BST film in the amorphous state formed at the first temperature is further subjected to annealing, thus maintaining this amorphous state. Thus, barrier effect of suppressing transmission of oxygen in the BST film in the amorphous state can be further increased.

<Other Embodiments of the Present Invention>

In the above-described embodiments, explanation is given for the case of forming the STO ($SrTiO_3$) film or the BST((Ba, Sr) $TiO_3$) film as the metal oxide film. However, the present invention is not limited thereto. Namely, the present invention can be suitably applied, even in a case of forming the metal oxide film on the substrates formed with the metal thin film on the surface, the metal oxide film containing at least one or more kinds of elements selected from the group consisting of hafnium, yttrium, lanthanum, aluminium, zirconium, strontium, titanium, barium, tantalum, niobium. Also, in the above-described embodiments, explanation is given for the case of forming the ruthenium thin film as the base metal thin film. However, the present invention is not limited to the above-described embodiments. Namely, the present invention can be suitably applied even in a case of forming the metal oxide film on the substrates formed with the metal thin film other than the ruthenium thin film. For example, the present invention can be suitably applied even in a case in which $(ZrO_2)_n(Y_2O_3)_{1-n}$ film is formed, with a titanium nitride (TiN) thin film as a base, or $(ZrO_2)_n(Al_2O_3)_{1-n}$ film is formed, with the titanium nitride thin film as a base.

Also, in the above-described embodiments, explanation is given for the case of forming the same kind film as that of the first step (S5) and the second step (S6). However, the present invention is not limited thereto. For example, it is possible to form a different kind film in the first step (S5) and the second step (S6) such as the STO film formed in the first step (S5), and the BST film formed in the second step (S6). Namely, it is possible to form a laminated film in which the different kind films are laminated in the first step (S5) and the second step (S6).

Also, in the above-described embodiments, explanation is given for the case of forming the metal oxide film by the ALD method. However, the present invention is not limited thereto, and the present invention can be suitably applied to a case of forming the metal oxide film by a CVD method.

Also, in the above-described embodiments, explanation is given for the case of depositing the film by using a sheet-feeding type ALD apparatus for processing one substrate at one time, as the substrate processing apparatus. However, the present invention is not limited to the aforementioned embodiments. For example, it is also possible to deposit the film by using the batch type vertical ALD apparatus for processing a plurality of substrates at one time. This vertical ALD apparatus will be explained hereunder.

Figure 9:
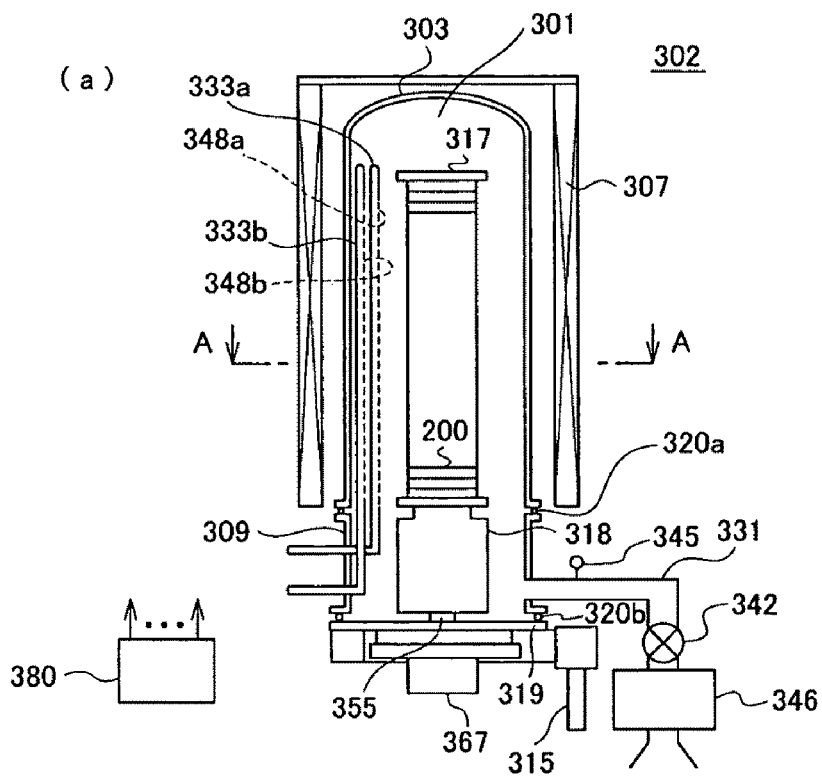
FIG. 9 is a schematic block diagram of a vertical processing furnace of a vertical ALD apparatus according to other embodiment of the present invention.
Figure 9:
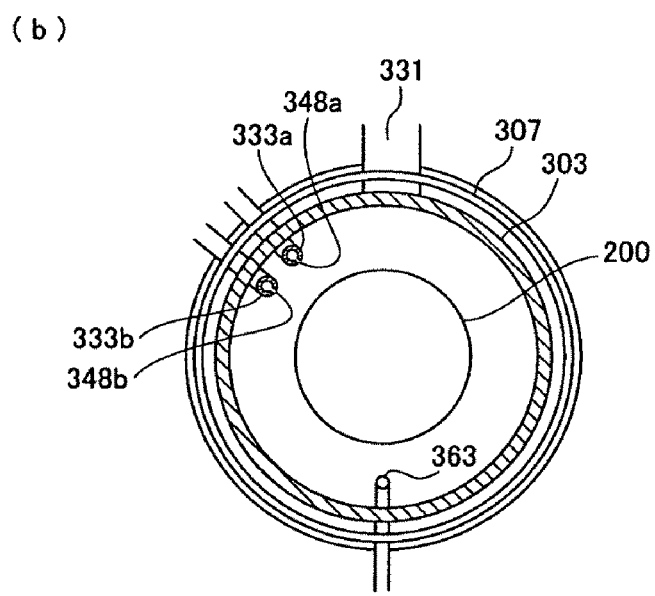

FIG. 9 is a schematic block diagram of a vertical processing furnace of the vertical ALD apparatus suitably used in this embodiment, and FIG. 9A shows a vertical sectional face of a processing furnace 302 part, and FIG. 9B shows the processing furnace part 302 taken along the line A-A.

As shown in FIG. 9A, the processing furnace 302 has a heater 307 as a heating unit (heating mechanism). The heater 307 has a cylindrical shape, and is vertically installed by being supported by a heater base (not shown) as a holding plate.

A process tube 303, being a reaction tube, is disposed inside of the heater 307 concentrically with the heater 307. The process tube 303 is composed of, for example, heat-resistant materials such as quartz ($SiO_2$) or silicon carbide (SiC), formed in a cylindrical shape, with the upper end closed and the lower end opened. A processing chamber 301 is formed in the cylinder hollow part of the process tube 303, so that the wafers 200, being the substrates, can be stored therein in a state of being arranged vertically in multiple stages in a horizontal posture.

A manifold 309 is disposed in a lower part of the process tube 303 concentrically with the process tube 303. The manifold 309 is composed of, for example, stainless, etc, and is formed in the cylindrical shape, with the upper end and the lower end opened. The manifold 309 is engaged with the process tube 303, so as to support the process tube 303. Note that an O-ring 320a, being a seal member, is provided between the manifold 309 and the process tube 303. By supporting the manifold 309 by the heater base, the process tube 303 is set in a state of vertically installed. The reaction vessel is formed by the process tube 303 and the manifold 309.

A first nozzle 333a, being a first gas inlet part, and a second nozzle 333b, being a second gas inlet part, are connected to the manifold 309, so as to penetrate the side wall of the manifold 309 and a part of the manifold 309 is communicated with the inside of the processing chamber 301. The first nozzle 333a and the second nozzle 333b are formed into L-shapes having a horizontal part and a vertical part respectively, with the horizontal part connected to the manifold 309, and the vertical part provided in an arcuate space between the inner wall of the reaction tube 303 constituting the processing chamber 301 and the wafers 200, on the inner wall from the lower part to the upper part of the reaction tube 303, along the stacking direction of the wafers 200. First gas supply holes 348a and second gas supply holes 348b, being supply holes for supplying gas, are respectively provided on the side face of the vertical parts of the first nozzle 333a and the second nozzle 333b. These first gas supply holes 348a and second gas supply holes 348b have the same opening areas extending from the lower part to the upper part, respectively, and further they are provided at the same opening pitch.

The gas supply system connected to the first nozzle 333a and the second nozzle 333b is the same as that of the aforementioned embodiment. However, in this embodiment, the source gas supply pipe 213 is connected to the first nozzle 333a, and the ozone gas supply pipe 213o is connected to the second nozzle 333b, and this point is different from the above-described embodiments. Namely, in this embodiment, the source gas (the first source gas, the second source gas, and the third source gas) and the ozone gas are supplied by different nozzles. Further, each source gas may be supplied by different nozzles.

An exhaust pipe 331 for exhausting the atmosphere in the processing chamber 301 is provided in the manifold 309. A pressure sensor 345, being a pressure detector, and a vacuum pump 346, being a vacuum exhaust device for vacuum-exhausting the inside of the processing chamber via an APC (Auto Pressure Controller) valve, are connected to the lower stream side, being the opposite side to the side connected to the manifold 309 of the exhaust pipe 331, so that the inside of the processing chamber 301 is vacuum-exhausted, to set the pressure at a prescribed pressure (degree of vacuum). Note that the APC valve 342 is an open/close valve capable of performing/stopping vacuum-exhaust the inside of the processing chamber 301 by opening/closing the valve, and further capable of adjusting the pressure inside of the processing chamber 301 by adjusting the opening degree of the valve.

A seal cap 319 is provided in the lower part of the manifold 309, as a lid member of a furnace port capable of air-tightly closing the lower end opening of the manifold 309. The seal cap 319 is brought into contact with the lower end of the manifold 309 from vertically lower side. The seal cap 319 is made of, for example, metal such as stainless, and is formed in a disc shape. An O-ring 320b is provided on the upper surface of the seal cap 319, as a seal member brought into contact with the lower end of the manifold 309. A rotating mechanism 367 for rotating a boat 317 as will be described later is placed on the opposite side of the processing chamber 301 across the seal cap 319. A rotary shaft 355 of the rotating mechanism 367 is passed through the seal cap 319 and is connected to the boat 317, and by rotating the boat 317, the wafers 200 are rotated. The seal cap 319 is vertically elevated by a boat elevator 315, being an elevating mechanism vertically disposed outside of the process tube 303, and thereby making it possible to load/unload the boat 317 into/from the processing chamber 301.

The boat 317, being a substrate holding tool, is made of a heat-resistant material such as quartz or silicon carbide, and is constituted to hold a plurality of wafers 200 in a horizontal posture, in a state of being arranged, with centers thereof aligned with one another, in multiple stages. Note that an insulating member 318 made of a heat-resistant material such as quartz or silicon carbide is provided in a lower part of the boat 317, so that heat from the heater 307 is hardly transmitted to the side of the seal cap 319. Note that the insulating member 318 may also be constituted of a plurality of insulating plates made of heat-resistant materials such as quartz or silicon carbide, and an insulating plate holder for holding these insulating plates in a horizontal posture in multiple stages. A temperature sensor 363, being the temperature detector, is set in the process tube 303, so that the temperature inside of the processing chamber 301 is set to show a prescribed temperature distribution, by adjusting a power supply condition to the heater 307 on the basis of the temperature information detected by the temperature sensor 363. In the same way as the first nozzle 333a and the second nozzle 333b, the temperature sensor 363 is provided along the inner wall of the process tube 303.

A controller 380, being a control part (control unit) controls operations of the APC valve 342, the heater 307, temperature sensor 363, vacuum pump 346, boat rotating mechanism 367, boat elevator 315, open/close valve 315, open/close valves vs1, to vs6, vb1 to vb6, vt1 to vt6, vo3 to vo6, liquid flow rate controllers 221s, 221b, 221t, 222s, 222b, 222t, and flow rate controllers 224s, 224b, 224t, 221o, 222o, 224o, etc.

Next, explanation will be given for the substrate processing step of forming the thin film on the wafers 200 by the ALD method, as one step of the manufacturing steps of the semiconductor device, by using the processing furnace 302 of the vertical ALD apparatus having the above-described structure.

Note that in the explanation given hereunder, the operation of each part constituting the vertical ALD apparatus is controlled by the controller 380.

A plurality of wafers 200 are charged into the boat 317 (change of wafers). Then, as shown in FIG. 7A, the boat 317 holding the plurality of wafers 200 are lifted by the boat elevator 315, and is loaded into the processing chamber 301 (boat loading). In this state, the lower end of the manifold 309 is set in a state of being sealed by the seal cap 319 via the O-ring 320b.

The inside of the processing chamber 301 is vacuum-exhausted by the vacuum exhaust apparatus 346 so as to be set in a desired pressure (degree of vacuum). At this time, the pressure inside of the processing chamber 301 is measured by the pressure sensor 345, and on the basis of this measured pressure, the pressure adjuster 342 is feedback-controlled. In addition, the inside of the processing chamber 301 is heated by the heater 307 so as to be set at a desired temperature. At this time, the power supply condition to the heater 307 is feedback-controlled on the basis of the temperature information detected by the temperature sensor 363, so as to obtain a desired temperature distribution. Subsequently, by rotating the rotating mechanism 367, the boat is rotated, thereby rotating the wafers 200.

Thereafter, for example in the same way as the aforementioned first embodiment to the third embodiment, by performing the first step (S5), the second step (S6), and the crystallizing step (S7), the SrTiO$_3$ thin film of a desired film thickness and the (Ba, Sr)TiO$_3$ thin film are formed on the wafers 200.

Thereafter, the seal cap 319 is lowered by the boat elevator 315, then the lower end of the manifold 309 is opened, and the wafers 200 after being formed with the thin film of a desired film thickness is unloaded to outside of the process tube 303 of the manifold 309 (boat unloading) in a state of being held by the boat 317. Thereafter, the processed wafers 200 are taken out from the boat 317 (discharge of wafers).

<Additional Description of Preferred Embodiments of the Present Invention>

Preferred embodiments of the present invention will be additionally described hereunder.

According to one aspect of the present invention, there is provided a method of manufacturing a semiconductor device, including:

a first step of forming a metal oxide film containing at least one or more kinds of elements selected from the group consisting of hafnium, yttrium, lanthanum, aluminium, zirconium, strontium, titanium, barium, tantalum, niobium, on a substrate having a metal thin film formed on the surface, at a first temperature allowing no oxidization of the metal thin film to occur, and allowing the metal oxide film to be set in an amorphous state; and a second step of forming a metal oxide film containing at least one or more kinds of elements selected from the group consisting of hafnium, yttrium, lanthanum, aluminium, zirconium, strontium, titanium, barium, tantalum, niobium on the metal oxide film formed in the first step, up to a target film thickness, at a second temperature exceeding (beyond) the first temperature.

According to another aspect of the present invention, there is provided a method of manufacturing a semiconductor device, including:

a first step of forming a metal oxide film containing at least one or more kinds of elements selected from the group consisting of hafnium, yttrium, lanthanum, aluminium, zirconium, strontium, titanium, barium, tantalum, niobium, on a substrate having a metal thin film formed on the surface, at a first temperature allowing no oxidization of the metal thin film to occur, and allowing the metal oxide film to be set in an amorphous state, and thereafter while maintaining the amorphous state of the metal oxide film, applying annealing to the metal oxide film, to densify the metal oxide film; and a second step of forming a metal oxide film containing at least one or more kinds of elements selected from the group consisting of hafnium, yttrium, lanthanum, aluminium, zirconium, strontium, titanium, barium, tantalum, niobium, up to a target film thickness, at a second temperature exceeding (beyond) the first temperature.

Preferably, the metal oxide film formed in the second step is a metal oxide film in a polycrystalline state or in an amorphous state in which the metal oxide film is more easily crystallized than the metal oxide film in the amorphous state formed in the first step.

Preferably, the metal thin film is a ruthenium film, and the metal oxide film is a strontium titanate film (STO) or a barium strontium titanate (BST) film.

Preferably, the first temperature is set at 200 to 350° C., and the second temperature is set at 300 to 400° C.

Preferably, the first temperature is set at 200 to 300° C., and the second temperature is set at 350 to 400° C.

Further preferably, the metal oxide film is formed by an ALD method or a CVD method.

Further preferably, the metal oxide film is formed by the ALD method.

Further preferably, the metal oxide film is formed by alternately supplying a source containing at least one or more kinds of elements selected from the group consisting of hafnium, yttrium, lanthanum, aluminium, zirconium, strontium, titanium, barium, tantalum, niobium, and an oxidant.

Further preferably, after the metal oxide film is formed up to a target film thickness, annealing is applied to the metal oxide film, and an overall metal oxide film formed in the first step and the second step is crystallized.

According to further another aspect of the present invention, there is provided a substrate processing apparatus, including:

a processing chamber that processes a substrate;

a source supply system that supplies at least one of the sources selected from the group consisting of a hafnium source, a yttrium source, a lanthanum source, an aluminium source, a zirconium source, a strontium source, a titanium source, a barium source, a tantalum source, and a niobium source;

an oxidant supply system that supplies oxidant;

a heater that heats the substrate in the processing chamber; and a controller that controls the source supply system, the oxidant supply system, and the heater, so that the source and the oxidant are supplied into the processing chamber to form a metal oxide film containing at least one or more kinds of elements selected from the group consisting of hafnium, yttrium, lanthanum, aluminium, zirconium, strontium, titanium, barium, tantalum, niobium, on a substrate having a metal thin film formed on the surface, at a first temperature not allowing oxidization of the metal thin film to occur and allowing the metal oxide film to be set in an amorphous state, and form a metal oxide film containing at least one or more kinds of elements selected from the group consisting of hafnium, yttrium, lanthanum, aluminium, zirconium, strontium, titanium, barium, tantalum, niobium, on the metal oxide film in the amorphous state, up to a target film thickness, at a second temperature exceeding the first temperature.

What is claimed is:

1. A method of manufacturing a semiconductor device, comprising:

forming a first metal oxide film containing at least one or more kinds of elements selected from the group consisting of hafnium, yttrium, lanthanum, aluminium, zirconium, strontium, titanium, barium, tantalum, niobium, on a substrate having a metal thin film formed on the surface, at a first temperature allowing no oxidization of the metal thin film to occur, and allowing the first metal oxide film to be set in an amorphous state, by ALD or CVD method; and forming a second metal oxide film containing at least one or more kinds of elements selected from the group consisting of hafnium, yttrium, lanthanum, aluminium, zirconium, strontium, titanium, barium, tantalum, niobium on the first metal oxide film in the amorphous state formed by film formation at the first temperature, up to a target film thickness for the first and second metal oxide films, at a second temperature exceeding the first temperature, by ALD method or CVD method.

2. The method of claim 1, wherein the second metal oxide film formed by the film formation at the second temperature is a metal oxide film in a polycrystalline state or in the amorphous state in which the second metal oxide film is more easily crystallized than the first metal oxide film in the amorphous state formed by the film formation at the first temperature.

3. The method of claim 1, wherein the metal thin film is a ruthenium film, and the first and second metal oxide films are strontium titanate films or barium strontium titanate films.

4. The method of claim 3, wherein the first temperature is set at 200 to 350° C., and the second temperature is set at 300 to 400° C.

5. The method of claim 3, wherein the first temperature is set at 200 to 300° C., and the second temperature is set at 350 to 400° C.

6. The method of claim 1, wherein the first metal oxide film formed by the film formation at the first temperature and the second metal oxide film formed by the film formation at the second temperature are formed by alternately supplying a starting material containing at least one or more kinds of elements selected from the group consisting of hafnium, yttrium, lanthanum, aluminium, zirconium, strontium, titanium, barium, tantalum, niobium, and an oxidant.

7. The method of claim 1, wherein after the first and second metal oxide films are formed up to the target film thickness by the film formation at the first temperature and by the film formation at the second temperature, annealing for crystallization is applied to the first and second metal oxide films, and an entire body of the first and second metal oxide films formed by the film formation at the first temperature and by the film formation at the second temperature is crystallized.

8. A method of processing a substrate, comprising:

forming a first metal oxide film containing at least one or more kinds of elements selected from the group consisting of hafnium, yttrium, lanthanum, aluminium, zirconium, strontium, titanium, barium, tantalum, niobium, on a substrate having a metal thin film formed on the surface, at a first temperature allowing no oxidization of the metal thin film to occur, and allowing the first metal oxide film to be set in an amorphous state, by ALD method or CVD method; and forming a second metal oxide film containing at least one or more kinds of elements selected from the group consisting of hafnium, yttrium, lanthanum, aluminium, zirconium, strontium, titanium, barium, tantalum, niobium on the first metal oxide film in the amorphous state formed by film formation at the first temperature, up to a target film thickness for the first and second metal oxide films, at a second temperature exceeding the first temperature, by ALD method or CVD method.

* * * * *